(12) United States Patent
Yang

(10) Patent No.: US 6,827,504 B2
(45) Date of Patent: Dec. 7, 2004

(54) BUTT JOINED ELECTRONIC ASSEMBLY AND MODULE HAVING AN ELECTRICAL STANDOFF

(75) Inventor: Kei-Wean C. Yang, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 332 days.

(21) Appl. No.: 10/155,465

(22) Filed: May 23, 2002

(65) Prior Publication Data

US 2003/0180009 A1 Sep. 25, 2003

Related U.S. Application Data

(60) Provisional application No. 60/366,357, filed on Mar. 20, 2002.

(51) Int. Cl.[7] ........................... G02B 6/36; H01R 13/514
(52) U.S. Cl. ........................... 385/92; 385/88; 385/139; 385/14; 439/701
(58) Field of Search ............................ 385/88–94, 14, 385/139; 439/701

(56) References Cited

U.S. PATENT DOCUMENTS

| 4,129,897 | A | | 12/1978 | Telewski et al. |
|---|---|---|---|---|
| 4,702,547 | A | | 10/1987 | Enochs |
| 5,583,468 | A | | 12/1996 | Kielmeyer et al. |
| RE35,869 | E | | 8/1998 | Mohwinkel |
| 6,271,579 | B1 | | 8/2001 | Going et al. |
| 6,292,052 | B1 | | 9/2001 | Carlson |
| 6,646,887 | B2 | * | 11/2003 | Yang et al. .................. 361/759 |
| 6,707,679 | B2 | * | 3/2004 | Yang ........................... 361/752 |
| 6,722,795 | B2 | * | 4/2004 | Yang ........................... 385/92 |
| 6,726,377 | B2 | * | 4/2004 | Yang ........................... 385/92 |

* cited by examiner

Primary Examiner—Akm Enayet Ullah
Assistant Examiner—Kevin S. Wood
(74) Attorney, Agent, or Firm—William K. Bucher

(57) ABSTRACT

A butt joined electronic assembly has first and second coplanar transmission structures that are independently aligned in a proximate abutting relationship. The coplanar transmission structures are formed on at least a first standoff dielectric substrate and on first and second electrical elements. The standoff dielectric substrate is positioned in an abutting relationship with one of the electrical elements. The standoff dielectric substrate and the first and second electrical elements are secured on respective independently positioned and mechanically joined first and second open end face carriers. The first and second coplanar transmission structures are electrically coupled together via substantially flat electrical conductors.

28 Claims, 12 Drawing Sheets

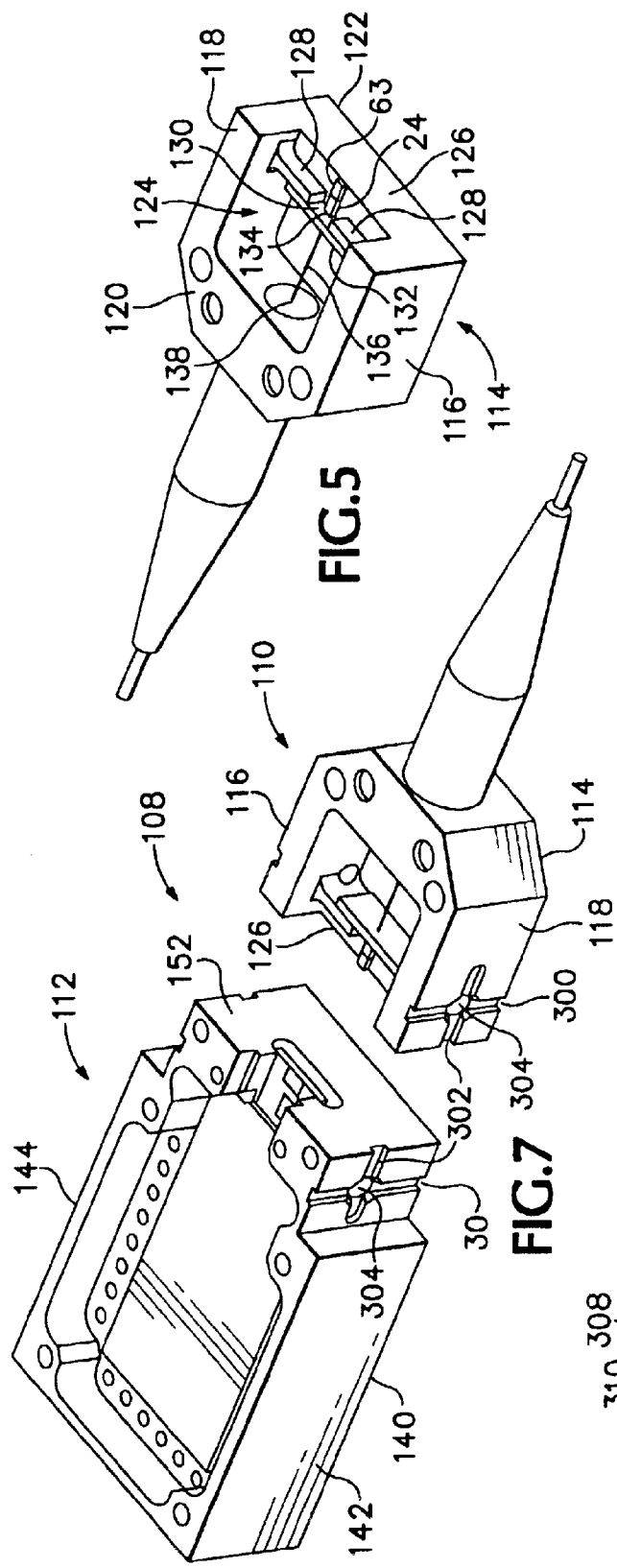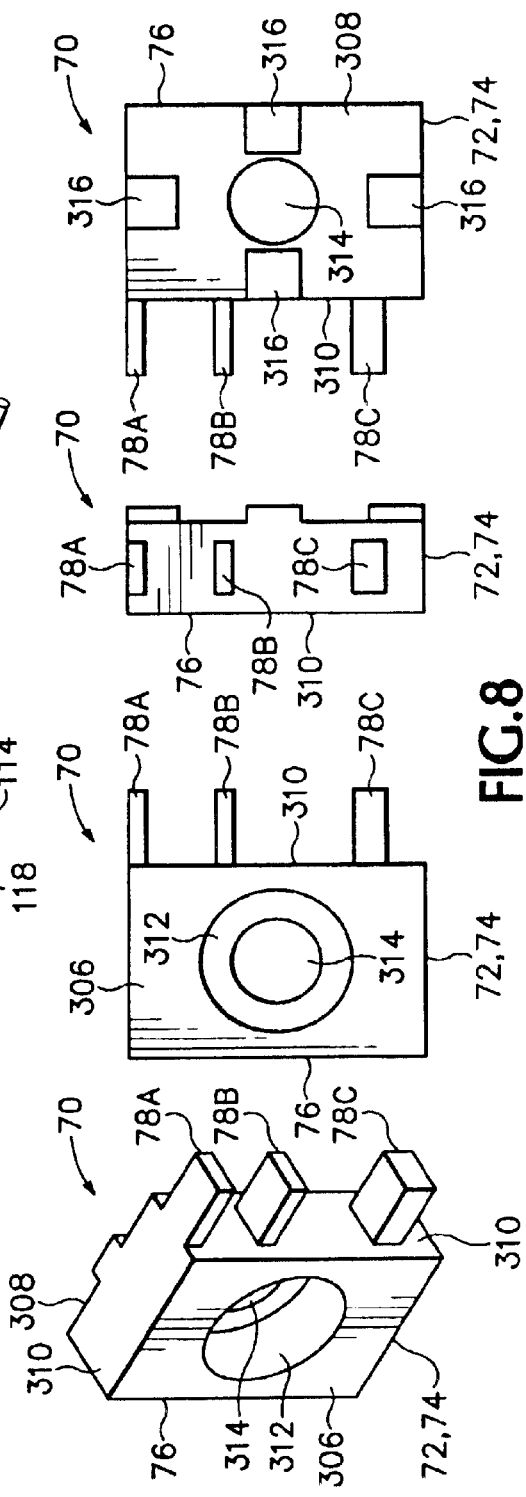

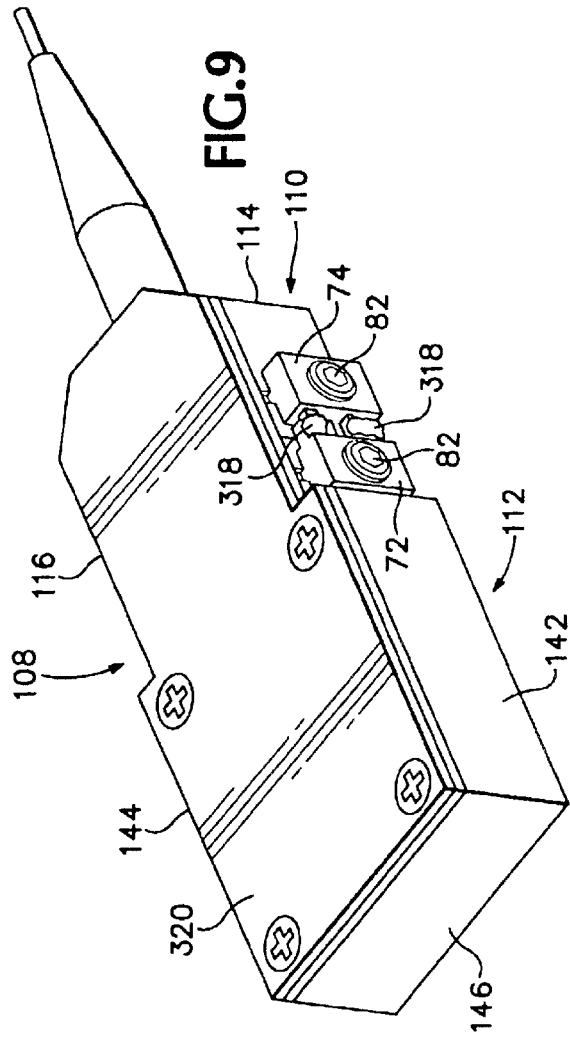
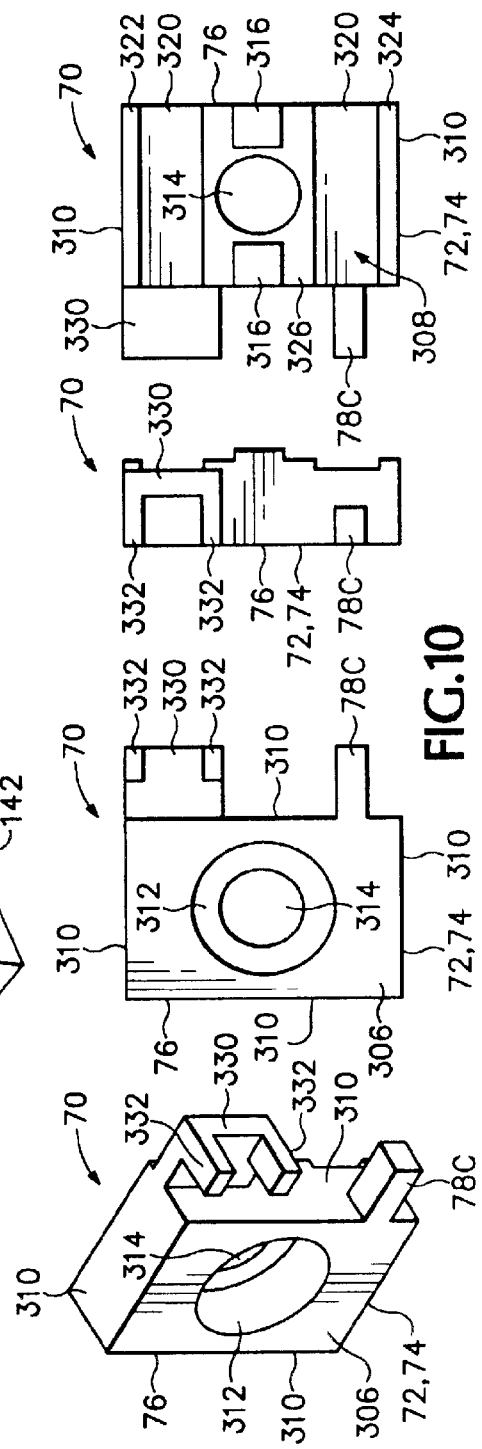

BUTT JOINED ELECTRONIC ASSEMBLY AND MODULE HAVING AN ELECTRICAL STANDOFF

CROSS-REFERENCE TO RELATED APPLICATION

This application claims the benefit of the U.S. Provisional Application No. 60/366,357, filed Mar. 20, 2002.

BACKGROUND OF THE INVENTION

The present invention relates generally to electronic assemblies and more particularly to butt joined electronic assemblies and modules operating at millimeter wavelength frequencies.

Recent advancements in optical communications technology have demonstrated optical data demuxing at a speed of over 160 Gbit/sec through a single mode optical fiber. At the same time, there is a lack of corresponding progress in test and measurement instrumentation to support analyzing these fast optical pulses. Current solutions are limited by interconnect issues that limit bandwidth and signal integrity, and manufacturing issues that can substantially increase the cost of components. One commercial solution is to couple an enclosed photodetector module with a conventional enclosed sampling head using a coaxial transmission line. The coupled modules are mounted in an optical plug-in module for a sampling oscilloscope. Another solution is to buy a high-speed photodetector as the optical-to-electrical (O/E) converter and use a sampling oscilloscope to capture the signal. This approach seems more beneficial for users because, in addition to having to spend less money, they can also maintain the electrical input to the scope for other testing needs. The inconvenience to users is that the screen is no longer calibrated for accurate power measurements. However, this inconvenience can be overcome by purchasing a separate power meter and perform a calibration manually. Users are faced with the choice of spending more money for the added power level calibration feature of an optical plug-in module or save $10 to 15 thousand dollars by buying a photodetector separately such that both electrical inputs and optical inputs can be measured with the same investment. The latter choice also provides users with a power meter which can be used elsewhere as well.

A common weakness for the above two solutions is that they both need electrical interconnections to connect the photodetector output to the sampler input. Because of the high frequencies involved, the connectors are quite expensive. Moreover, aside from introducing additional costs to the system, these components also introduce unwanted impedance mismatching that produces in signal reflections. These signal reflections result in waveform distortion as a function of bit pattern when measuring fast repetitive signals, such as the RZ 40 Gb/Sec optical data.

A solution to these problems is to combine the detector and sampler semiconductor devices together to form a fully integrated photodetector-sampler IC design. This would eliminate all of the interconnecting hardware between the photodiode and sampler. While a fully integrated photodetector-sampler design (FIPS) sounds good, it runs into practical problems during implementation. Generally, test equipment manufactures are not vertically integrated companies that have the processing technology or the equipment to produce FIPS designs. In addition, high speed photodetector manufacturers generally specialize in producing optical components, such as O/E and E/O converters, but not electrical components, such as electrical samplers. Conversely, electrical component manufactures do not manufacture optical components. To produce the FIPS design would require capital investment and technology development by optical or electrical component manufactures or the test and measurement equipment manufacturer.

Another issue with the FIPS design is yield loss of the final assembly if either of the optical detector or sampler sections develop problems. The photodiode performance cannot be accurately characterized until permanently mounted on or within a carrier or housing, an optical fiber aligned to the photodiode, and electrically coupled to the sampler section. If the output of the competed FIPS device does not meet design specifications, it is difficult to determine if the problem has to do with the fiber alignment, photonic and impulse responses of the diode, polarization sensitivity and the like in the optical detector section or signal gain, sensitivity and the like in the sampler section. Even if the performance problem can be identified to one of the sections, replacing the defective section may lead to damage of the other section.

Another problem with the FIPS design is negotiating refunds on defective parts. Since different manufacturers make the components for the optical and sampler sections and one or the other or a system integrator, such as the test and measurement manufacturer, performs the final integration, determining the cause of the failed part or parts in the sections can be a source of conflict. For example, the problem may be determined within the photodetector module, say a lower than spec photo response. The problem could have been caused by the photodiode die being damaged during the FIPS processing; the optical fiber being misaligned from the integrator assembly process; the optical fiber end surface polishing being flawed; the fiber/detector IC junction having foreign contaminations not readily visible to the eye; the wire bond from the detector IC to the sampler IC having excessive inductance introduced by improper wirebonding; the wirebonder damaging the detector IC by improper bonding control, such as excess bond head ultrasonic energy or pressure, and the like. The photodetector IC manufacturer may be reluctant to refund the cost of the multi-thousand dollars detector IC where the defect is caused by a defective assembly process.

What is needed is an electronic assembly and module design that overcomes the shortcomings of the FIPS and the coaxial interconnect designs. The electronic assembly and module design should allow independent testing and verification of separate sections of the module prior to final assembly or integration. The electronic assembly and module should allow for easy assembly and alignment of the separate device sections down to the micron level.

SUMMARY OF THE INVENTION

Accordingly, the present invention is to a butt joined opto-electronic assembly and module for millimeter wavelength frequencies that allows independent alignment of coplanar transmission structures formed on opto-electrical and electrical elements in a proximate abutting relationship. The opto-electrical and electrical elements are mounted on respective independently positioned and mechanically joined open end face carriers and housings. The butt joined opto-electronic assembly has first and second carriers with each carrier having an open end face. The first carrier has an opto-electrical element positioned on the carrier. The opto-electrical element has an opto-electrical device formed on at least a first horizontal surface of the carrier that is coupled to receive an optical signal from an optical waveguide secured to the carrier. The second carrier has an electrical element positioned on the carrier with an electrical device formed on at least a first horizontal surface of the electrical element.

The opto-electronic module has first and second housings with each housing having sidewalls and end walls. A cavity is formed in the housing bounded on three sides by the sidewalls and one of the end walls. Each cavity intersects the other end wall of its housing defining an open end face on the housing. The first housing has the opto-electrical element positioned in the cavity of the housing. The opto-electrical device formed on the horizontal surface of the opto-electrical element is coupled to receive an optical signal from an optical waveguide secured to the first housing. The second housing has the electrical element positioned in the cavity of the housing with the electrical device formed on the horizontal surface of the electrical element. Each housing may be provided with a removable top cover that is mounted on the end wall and the sidewalls bounding the cavity. Preferably, a single removable top cover is mounted on the end walls and the sidewalls bounding the cavities of the first and second housings.

Each of the opto-electrical and electrical elements has a coplanar transmission structure formed on one of the horizontal surfaces. Each coplanar transmission structure is electrically coupled to one of the respective opto-electrical and electrical devices. A standoff dielectric substrate is positioned in an abutting relationship with at least one of the opto-electrical and electrical elements. The standoff dielectric substrate has opposing vertical walls and a horizontal surface on which is formed a coplanar transmission structure. The coplanar transmission structure on the standoff dielectric substrate extends to two of the opposing end walls of the substrate and is positioned in a coplanar relationship with the abutting opto-electric or electrical element and electrically couple via substantially flat electrical conductors. The coplanar transmission structures of the standoff dielectric substrate and the other of the opto-electrical and electrical elements are independently aligned in three mutually perpendicular planes and positioned in a proximate abutting relationship. The first and second carriers of the opto-electronic assembly and the first and second housings of the opto-electronic module are independently positioned and mechanically joined together as a single assembly or module at the open end faces by a securing member with the first and second carriers or modules being linearly and rotationally positionable in three mutually perpendicular planes relative to each other to align the coplanar transmission structures of the standoff dielectric substrate and the other element of the opto-electrical and electrical elements. Substantially flat electrical conductors, such as wedge bonded electrical conductors, electrically couple the coplanar transmission structures of the standoff dielectric substrate and the other element of the opto-electrical and electrical elements together. The invention may also be implemented with a standoff dielectric substrate abutting each of the opto-electrical and electrical elements with the coplanar transmission structures of the standoff dielectric substrates being independently aligned in three mutually perpendicular planes and in a proximate abutting relationship.

In the preferred embodiment, the securing member has removable mechanical attachment members secured to the side surfaces of the first and second carriers or modules. The removable attachment members are secured on the side surfaces of the first and second carriers or modules adjacent to their respective open end faces. Each removable attachment member has first and second links secured to the respective side surfaces of the carriers and housings with each link having a base and at least a first extension member. At lest one of the extension members of each of the first and second removable attachment members projects past one of the open end faces to overlap the other extension member. The overlapping extension members are secured together to join the carriers or housings together as a single assembly or module. In the preferred embodiment, solder is applied to the overlapping extension members. Alternately, an adhesive, such as an epoxy or ultraviolet cured epoxy, may be applied to the overlapping extension members.

The standoff dielectric substrate and the abutting one of the opto-electrical and electrical elements and the other of the opto-electrical and electrical elements may be positioned on the carriers of the assembly and in the cavities of the opto-electronic module housings away from the open end faces of the carrier and housings. One or both of the standoff dielectric substrate and the other of the opto-electrical and electrical elements may also extend to the open end faces of the carriers or housings or one or both may extend past the open end faces of the carriers or housings. Each of the standoff dielectric substrate and associated element and the other of the elements may be positioned on their respective carrier or housing in any of the above positioning relationships so long as the proximate abutting relationship of the coplanar transmission structures of the standoff dielectric substrate or substrates and the other of the elements produces a sub-millimeter separation between the ends of the coplanar transmission structures. For example, the standoff dielectric substrate abutting the opto-electrical element may be set back from the end face of its carrier or housing and the electrical element may extend past the open end face of its carrier or housing.

A mounting dielectric substrate may be mounted on one or both of the carriers of the opto-electronic assembly or in one or both of the cavities of the opto-electronic module housings. Each substrate has an end face that may be positioned away from the open end face of its carrier or housing, extend to the open end face of the carrier or housing, or extend past the open end face of the carrier or housing. The standoff dielectric substrate or substrates and the opto-electrical and electrical elements are secured to the mounting dielectric substrates with the standoff dielectric substrate or substrates and the other of the opto-electrical and electrical elements positionable away from, extending to or extending past the end face of its mounting dielectric substrate. Multiple positioning combinations of the mounting dielectric substrate or substrates may be combined with the multiple positioning combinations of the standoff dielectric substrate or substrates and the other of the opto-electrical and electrical elements. For example, the opto-electrical section or module may have the mounting dielectric substrate positioned away from the open end face of the carrier or housing with the standoff dielectric substrate abutting the opto-electrical element extending past the end face of the mounting dielectric substrate. The electrical section or module may have the electrical element positioned on the carrier or in the cavity of the housing with the electrical element extending past the open end face of the carrier or housing. In another example, the opto-electrical and electrical sections or modules may each have a mounting dielectric substrate mounted on the respective carriers or in the respective cavities of the housings. The mounting dielectric substrates may both extend past the open end faces of their respective carriers or housings with each of the opto-electrical and electrical elements having abutting standoff dielectric substrates that extend past the end faces of their respective mounting dielectric substrates.

The opto-electrical device formed on the opto-electrical element may be an optical-to-electrical converter, such as a photodiode, a semiconductor laser, an optical modulator or other types of devices that receives an electrical signal to generate or modulate an optical device or generates an electrical signal in response to a received optical signal. The electrical device formed on the electrical element may be at least a first sampling diode of a sampling circuit, a laser driver, an amplifier or the like.

The objects, advantages and novel features of the present invention are apparent from the following detailed description when read in conjunction with appended claims and attached drawings.

BRIEF DESCRIPTION OF THE DRAWINGS

FIG. 5 is a perspective view of the opto-electrical module of the butt joined electronic module according to the present invention.

FIG. 7 is a perspective view of the housings of the butt joined electronic module according to the present invention illustrating the removable mechanical attachment members.

FIG. 8 illustrates various views of one embodiment of the links of the removable attachment members used in the butt joined electronic assembly and module according to the present invention.

FIG. 9 is a perspective view of the joined housings of the butt joined electronic module according to the present invention.

FIG. 10 illustrates various views of a further embodiment of the links of the removable attachment members used in the butt joined electronic assembly and module according to the present invention.

DETAILED DESCRIPTION OF THE PREFERRED EMBODIMENT

Figure 1:
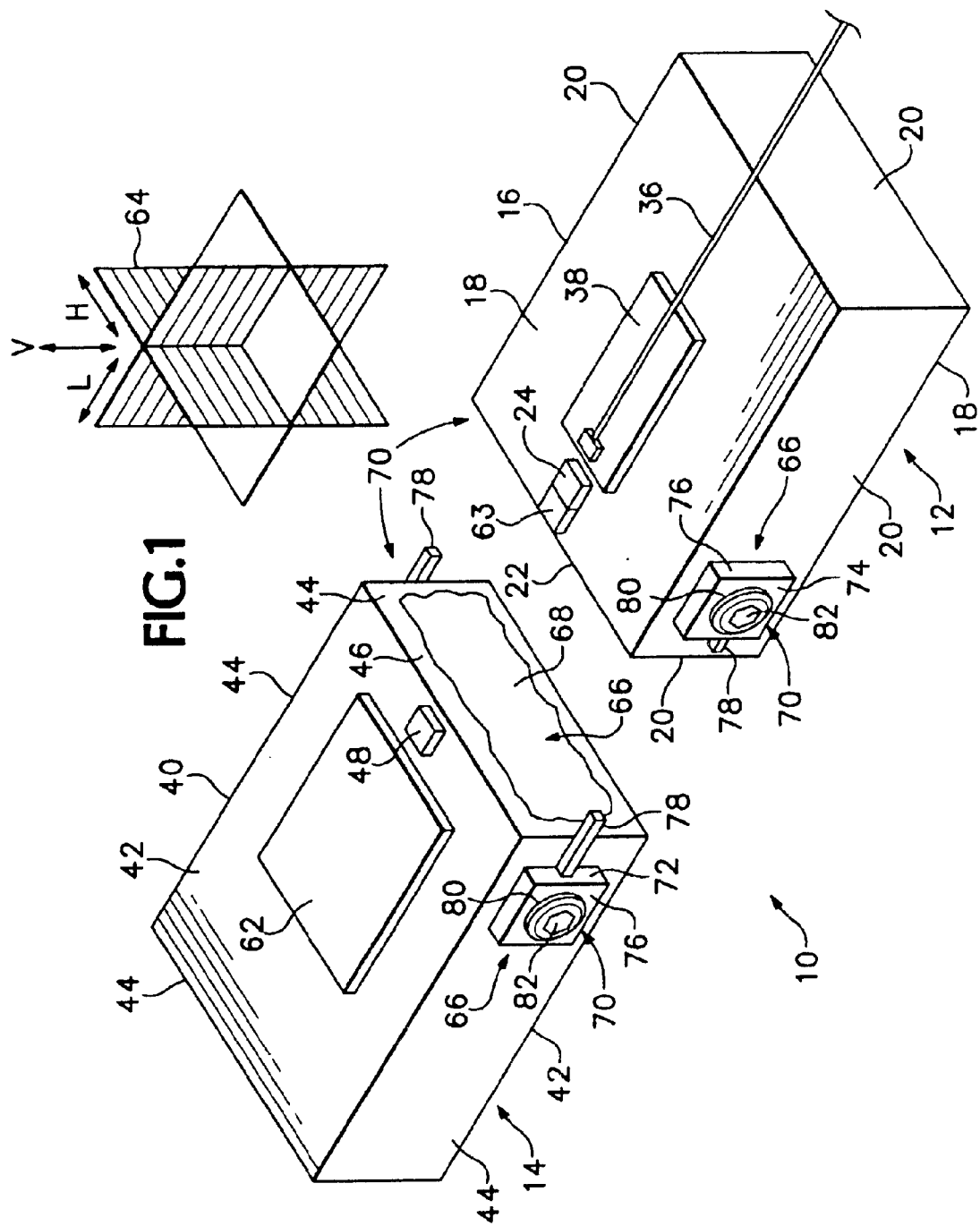
FIG. 1 is a perspective view illustrating a first embodiment of a butt joined electronic assembly having a standoff dielectric substrate according to the present invention.
Figure 2:
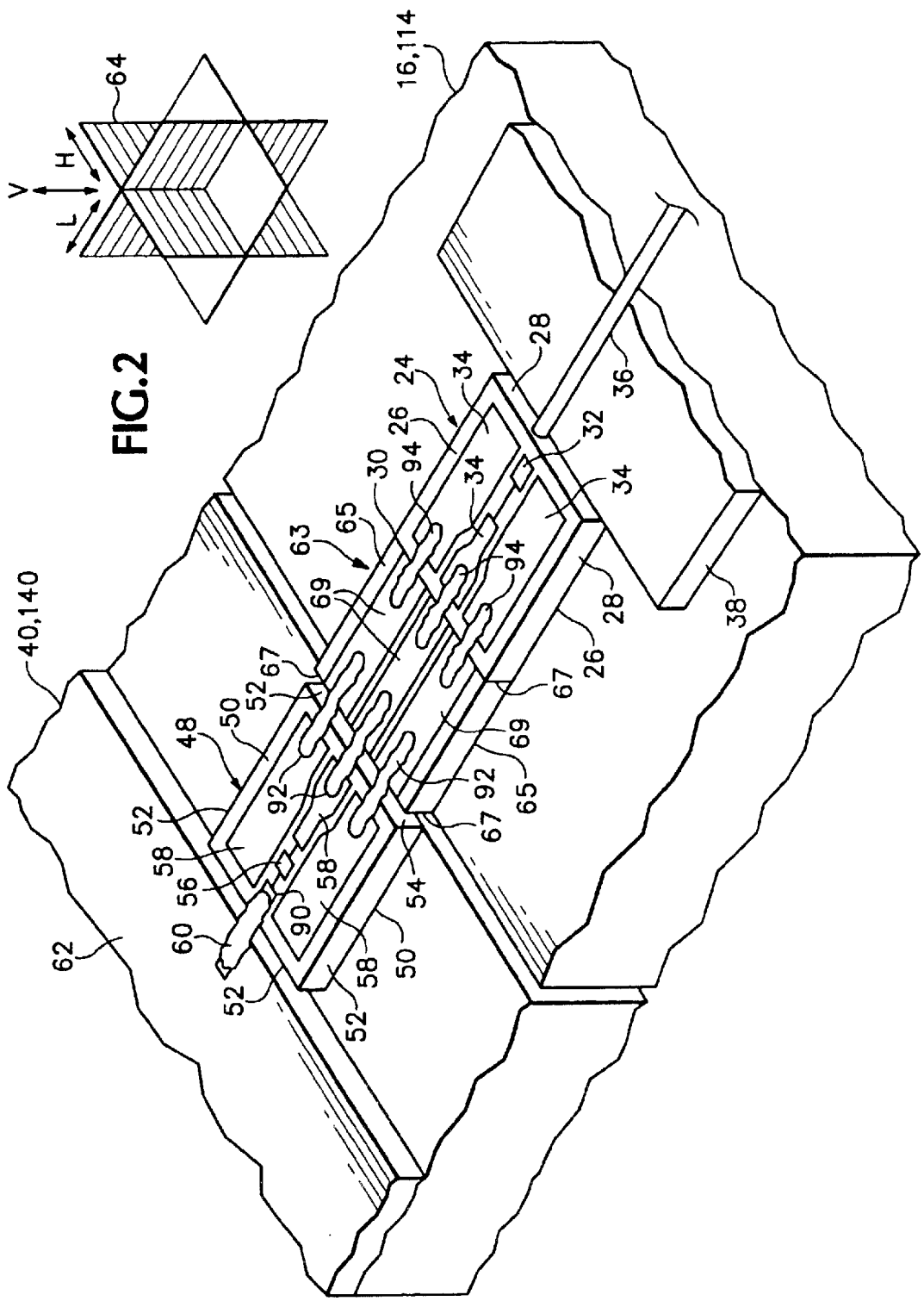
FIG. 2 is a detailed perspective view of the joined standoff dielectric substrate with one of the optical and electrical elements of the butt joined electronic assembly and module according to the present invention.

The butt joined opto-electronic assembly and module of the present invention has independently positioned and mechanically joined open end faced opto-electrical and electrical sections or housings for aligning in proximate butt joined relationship coplanar transmission structures positioned on the opto-electrical and electrical sections or housings. The butt joined opto-electronic assembly and module couples extremely high frequency electrical signals, in the range of 30 GHZ. to 300 GHz, between the coplanar transmission structures of the opto-electrical and electrical sections or housings. FIG. 1 show a perspective view of a first embodiment of a butt joined opto-electronic assembly 10 having an opto-electrical section 12 and an electrical section 14. The opto-electrical section has a carrier 16 having opposing horizontal surfaces 18 and side surfaces 20 with one of the side surfaces defining an open end face 22. The carrier 16 is made of any suitable solid material that provides a rigid base for receiving optical or electrical components, substrates and the like. Such materials include, but not limited to, metals such as brass or the like, glass, plastic and the like. An opto-electrical element 24 is positioned on the carrier 16 and secured using an adhesive, such as a conductive or non-conductive epoxy. The opto-electrical element 24 (as best shown in FIG. 2) has opposing horizontal surfaces 26 and side surfaces 28 with one of the side surfaces defining an end face 30. An opto-electrical device 32, such as an optical-to-electrical converter implemented as a semiconductor photodiode, a semiconductor laser, an optical modulator or the like, is formed on one of the horizontal surfaces 26 of the opto-electrical element 24. A coplanar transmission structure 34 is formed on one of the horizontal surfaces 26 and has one end electrically coupled to the opto-electrical device 32. The other end of the coplanar transmission structure 34 is disposed adjacent to the end face 30 of the opto-electrical element 24. An optical waveguide 36, such as an optical fiber, may be mounted on a substrate 38 as is described in U.S. Pat. No. 4,702,547, titled "Method for Attaching an Optical Fiber to a Substrate to form an Optical Fiber Package". The optical waveguide 36 is optically aligned with the opto-electrical device 32 for coupling an optical signal to or from the opto-electrical device 32. Alternately, the optical waveguide 36 may be formed as part of the substrate 38 and optically aligned with the opto-electrical device 32. The optical fiber is then optically aligned with the substrate optical waveguide.

The electrical section 14 has a carrier 40 of similar design to carrier 16 of the opto-electronic section 12 with the carrier 40 having opposing horizontal surfaces 42 and side surfaces 44 with one of the side surfaces defining an open end face 46. The carrier 40 is preferably made of the same material as the carrier 16 for the opto-electrical section 12. An electrical element 48 is positioned on the carrier 40 and secured using an adhesive, such as a conductive or non-conductive epoxy. The electrical element (as best shown in FIG. 2) has opposing horizontal surfaces 50 and side surfaces 52 with one of the side surfaces defining an end face 54. The electrical element 48 is preferably formed of a semiconductor material and has an electrical device 56, such as a sampling diode, laser driver, amplifier or the like, formed on one of the horizontal surfaces 50. A coplanar transmission structure 58 is formed on one of the horizontal surfaces 50 and has one end electrically coupled to the electrical device 56. The other end of the coplanar transmission structure 58 is disposed adjacent to the end face 54 of the electrical element 48. The electrical element 48 is electrically coupled via an electrical conductor 60, such as bond wires, gold foil and the like, to a substrate 62 mounted on the carrier 40 having additional electronic circuitry formed thereon.

The coplanar transmission structures 34 and 58 are preferably impedance and dimensionally matched in a 50 ohm environment. However, the use of different substrate materials for the opto-electrical and electrical elements 24 and 48 may result in 50 ohm coplanar transmission lines of differing dimensions on one of the opto-electrical or electrical elements 24 and 48. Further, the patterned coplanar transmission structures 34 and 58 formed on the opto-electrical and electrical elements 24 and 48 are formed of thin layers of gold over an adhesion material, such as titanium and/or platinum plating. Excessive probing or wire or wedge bonding to the coplanar transmission structures 34 and 58 will remove portions of the gold layer destroying the electrical connectivity of the transmission structure. The flexibility and robustness of the opto-electronic assembly and module 10 may be increased by adding one or more standoff dielectric substrates 63. The standoff dielectric substrate 63 (as best shown in FIG. 2) has opposing horizontal surfaces 65 and opposing vertical end walls 67 with a coplanar transmission structure 69 formed on one of the horizontal surfaces. The standoff dielectric substrate 63 is formed of a dielectric material, such as aluminum oxide or the like, with the coplanar transmission structure 69 having coplanar elements extending to the end walls 67 of the substrate 63. This structure is in contrast to current standoff dielectric substrates where the coplanar transmission structure does not extend to the end walls of the substrate. This is due to the method of manufacturing the standoff dielectric substrates. The traditional method of manufacturing standoff dielectric substrates is to lay down multiple coplanar transmission structures on the dielectric substrate. The dielectric substrate is then laser scribed and the individual standoff dielectric substrates are snapped off from the larger dielectric substrate. The resulting standoff dielectric substrate has vertically jagged end walls due to the snapping off process.

Extending the coplanar elements of the coplanar transmission structure 69 to the end walls 67 of the standoff dielectric substrate 63 decreases the separation between the coplanar transmission structures 34 and 58 on opto-electrical and electrical elements 24 and 48 and the coplanar transmission structure 69 on the standoff dielectric substrate 63. The process for producing a standoff dielectric substrate 63 with a coplanar transmission structure 69 extending to the end walls 67 of the substrate requires the use of low temperature soluble wax to protect the coplanar transmission structure during processing. A number of coplanar waveguide structures 69 are formed on a wafer of dielectric material using a thin layer of gold. The low temperature water soluble wax, such as Crystal Bond or the like, is placed over the coplanar transmission structures 69 to protect the structures during manufacture. Tape is placed over the wax to prevent the wax from being washed off during processing and to prevent the standoff dielectric substrates 63 from being lost during processing. The wafer of dielectric material is then sawn on a line that intersects the coplanar elements of the coplanar transmission structure 69. A coolant, such as a water jet, is applied to the wafer during the sawing process to prevent heat buildup. The wax is used to prevent the coplanar transmission structures 69 from lifting off the wafer during the sawing process. The tape prevent the protects the water soluble wax from being removed by the water jet. After the end walls 67 of each of the standoff dielectric substrates 63 are cut, the tape is removed and the water soluble wax is washed off the finished substrates 63. The standoff dielectric substrate 63 is positioned one or both of the carriers 16 and 40 in an abutting relationship with the opto-electrical or electrical elements 24 and 48 and secured using an adhesive, such as a conductive or non-conductive epoxy.

In an alternate cutting process, the standoff dielectric substrate 63 may be cut in situ on the carriers 16 and 40. The standoff dielectric substrate 63 is formed using the above described process with the initial length of the substrate 63 being longer than needed. The standoff dielectric substrate 63 is mounted on one or both of the carriers 14 and 40 abutting the respective end faces 22 and 46. The water soluble wax is applied to the standoff dielectric substrate 63 and the tape is applied over the wax. The standoff dielectric substrate 63 and the carrier 16, 40 are then sawn together with the result being the standoff dielectric substrate 63 abutting the end face 22, 46 of the carrier 14, 40.

Figure 3A:
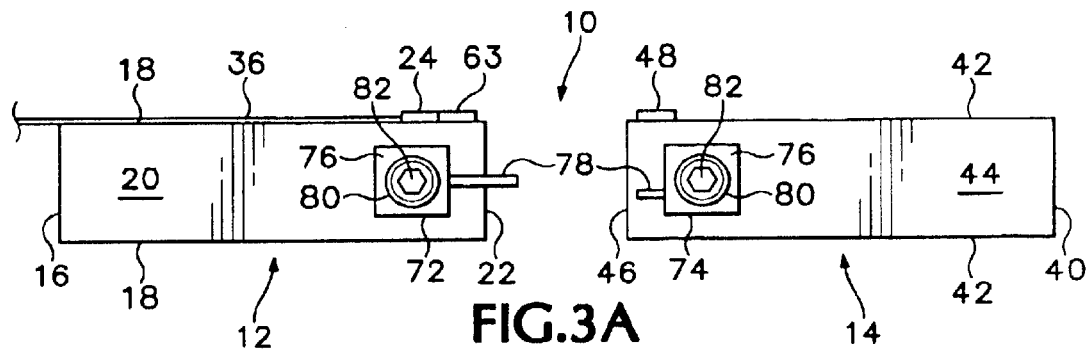
FIGS. 3A–3X are side views of various configurations of the standoff dielectric substrate or substrates with the optical and electrical elements in the butt joined electronic assembly and module according to the present invention.
Figure 3B:
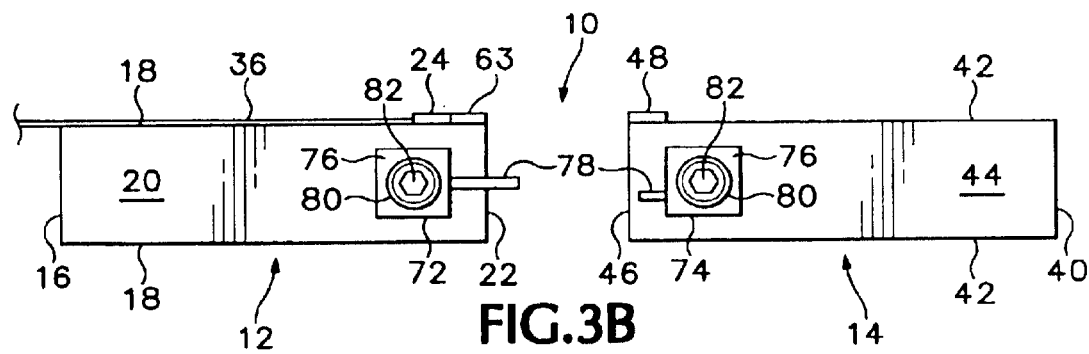
Figure 3C:
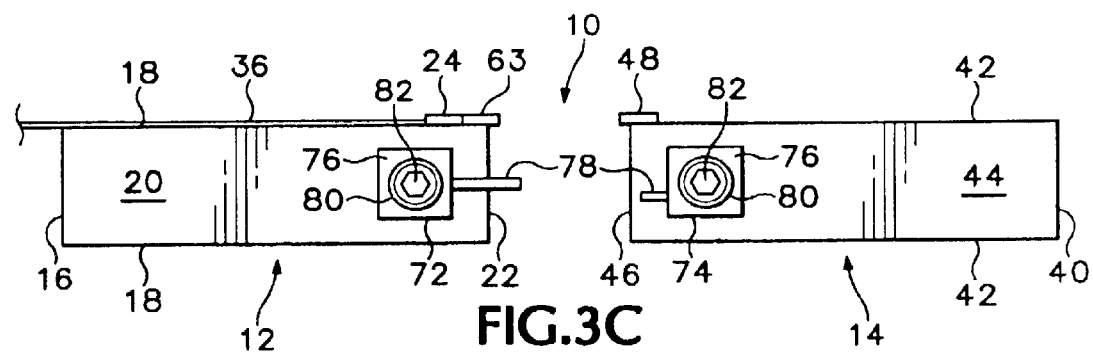
Figure 3D:
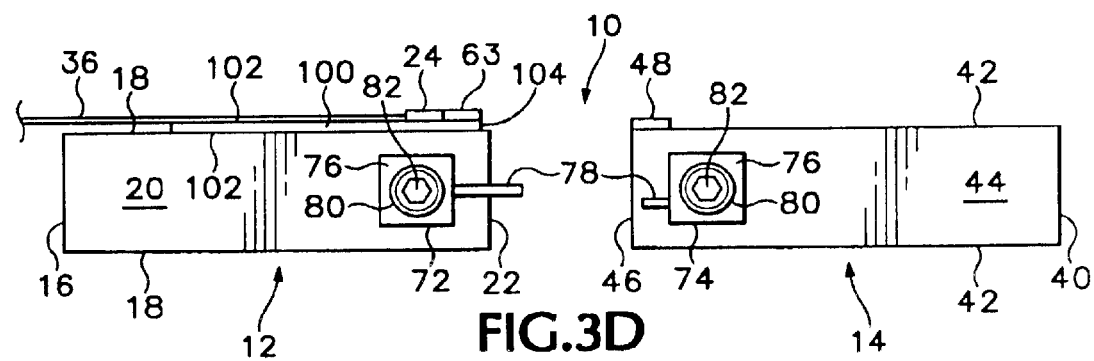
Figure 3E:
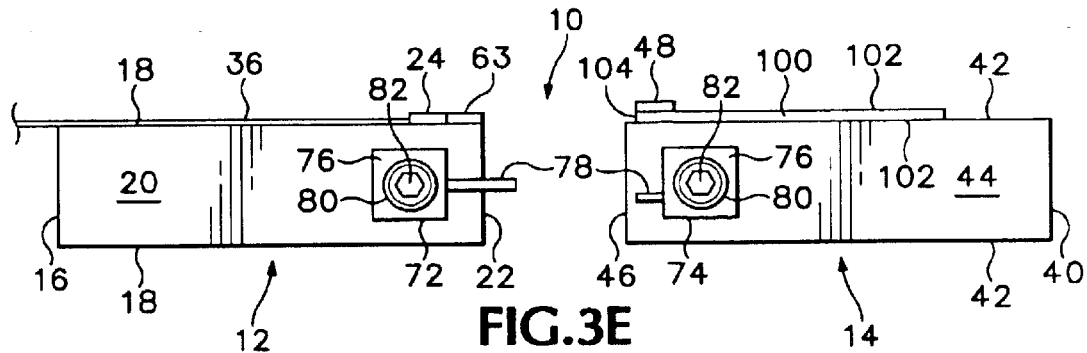
Figure 3F:
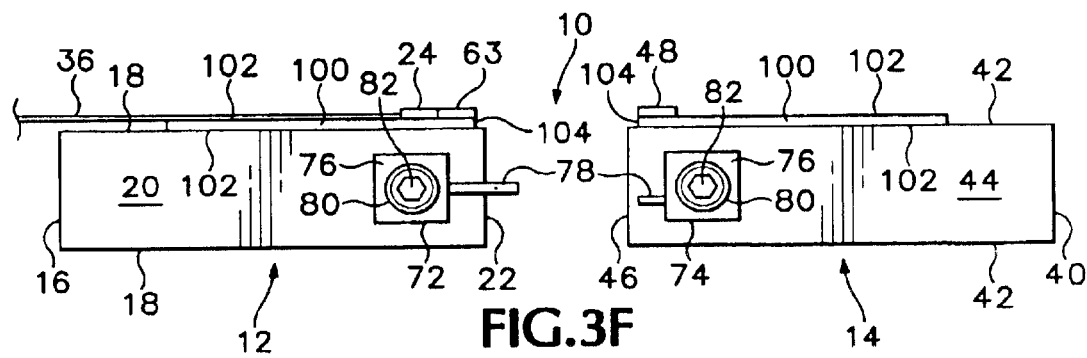

The inductance of the coplanar transmission structure 69 should match the inductance of the coplanar transmission structures 34 and 58. Where the coplanar transmission structures 34 and 58 are dimensionally matched, as in FIG. 2, the elements of the coplanar transmission structure 69 of the standoff dielectric substrate 63 has the same dimensions across the substrate. Where the coplanar transmission structures 34 and 58 are dimensionally mismatched, the dimensions of the coplanar elements of the coplanar transmission structure 69 of the standoff dielectric substrate 63 transition across the substrate from the dimension of the one coplanar transmission structure to the dimension of the other coplanar transmission structure while maintaining the characteristic impedance from one coplanar transmission structure to the other. As illustrated in FIGS. 1 and 2, the standoff dielectric substrate 63 is positioned on the carrier 16 of the opto-electrical section 12 in an abutting relationship with the opto-electrical element 24. The standoff dielectric substrate 63 may also be positioned on the carrier 40 of the electrical section 14 in an abutting relationship with the electrical element 48 or each of the opto-electrical and electrical elements 24 and 48 may have an abutting standoff dielectric substrate 63 as best illustrated in FIGS. 3A–3X.

The carriers 16 and 40 of the opto-electrical and electrical sections 12 and 14 are linearly and rotationally positionable relative to each other in three mutually perpendicular planes as represented by the mutually orthogonal planes 64. The sections 12 and 14 are moveable up-and-down in the vertical direction, side-to-side in the horizontal direction and in-and-out in the lateral direction. A securing member 66 joins the respective carrier 16 and 40 together as a single assembly 10. The securing member 66 may take the form of an adhesive 68 applied to the abutting open end face surfaces 22 and 46 of the carriers 16 and 40. One such adhesive is an epoxy. A drawback to using a standard epoxy adhesive is the long drying time. This can be overcome by forming the carriers 16 and 40 from a transparent material and using an ultraviolet cured epoxy. A drawback to using an adhesive to secure the carriers 16 and 40 together is that it difficult to impossible to separate the joined carriers without damaging them. A preferred securing member is removable mechanical attachment members 70 that are mounted on opposing sidewalls 20 and 44 of the carriers 16 and 40 adjacent to their open end faces 22 and 46. Each attachment member 70 have respective first and second links 72 and 74 with each link having a base 76 and an extension member 78. The links 72 and 74 are preferably made of metal, such as brass, steel or the like. Each base 72 has a bore 80 formed therethough that accepts a threaded screw 82. Each screw 82 is received in a threaded aperture (not shown) formed in the sidewalls 20 and 44 of the carriers 16 and 40 and tightened to secure the links 72 and 74 to their respective carriers 16 and 40. At least one of the extension members 78 of the first and second links 72 and 74 extends past the open end face 22, 46 of its carrier. The other extension member 78 extends outward from the base 76 toward the open end face 22, 46 of its carrier. The other extension member 78 may also extend past the open end face of its carrier. As the two carriers 16 and 40 are positioned together to align the coplanar transmission structures 58, 69, the extension members 78 overlap each other.

Once the coplanar transmission structures 58, 69 are aligned, the extension members 78 are secured together to mechanically join the carriers 16 and 40 together as one assembly. Preferably, the extension members 78 are secured together using a 60/40 tin-lead solder. Alternately, an adhesive, such as an epoxy, UV cured epoxy or a low melting temperature metal with strong adhesion like indium, can be used to secure the extension members together. An advantage of using the removable attachment members 70 is the ability to disassemble the opto-electronic assembly to replace a defective section 12, 14 of the assembly if one of the sections fails. All that is mechanically required is to remove the screws 82 securing the links 72 and 74 to the carriers 16 and 40. This type of disassembly and replacement of defective components is substantially faster and safer than attempting to replace opto-electrical and electrical elements integrated onto a single substrate.

FIG. 2 is a closeup perspective view of the butt joined interface between the carriers 16 and 40 and the coplanar transmission structures 34, 58 and 69. In the preferred embodiment, the opto-electronic element 24 is formed of a semiconductor material with the opto-electrical device 32 being an optical-to-electrical converter. The optical-to-electrical converter 32 is preferably a photodetector having heterojunction structures bases on III–V semiconductor materials, such as an indium-phosphate (InP) semiconductor photodiode manufactured and sold by u2t Photonics GmbH, Berlin, Germany. The photodiode 32 is formed at one end of the opto-electrical element 24 and is electrically coupled to the center conductor of the coplanar transmission structure 34 formed on the top horizontal surface of the opto-electrical element. The other end of the coplanar transmission structure 34 is disposed adjacent to the opposing end face 30 of the opto-electrical element 24. The end face 30 of the opto-electrical element 24 is butted against one of the end walls 67 of the standoff dielectric substrate 63 terminating the coplanar transmission structure 69 with the coplanar transmission structures 34 and 69 being coplanar. The other end wall 67 terminating the coplanar transmission structure 69 is positioned adjacent to the open end face 22 of the carrier 16 to provide micron separation between the coplanar transmission structures 69 and 58. The coplanar transmission structures 34 and 69 on the standoff dielectric substrate 63 and the opto-electrical element 24 are electrically coupled together using substantially flat electrical conductors 94, such as wedge bonded gold ribbon wire, bond wires or the like. Electrical leads (not shown) couple electrical power to the semiconductor photodiode 32. The dielectric substrate 38 has the optical waveguide 36 formed therein and is positioned adjacent to and optically aligned with the photodiode 32 to provide optimum optical energy input to the photodiode. An optical fiber is optically aligned with the waveguide 36 for coupling an optical signal through the waveguide 36 and onto the photodiode 32.

Alternately, the opto-electrical device 32 may be formed on one of the horizontal surfaces 26 of the opto-electrical element 24 and the coplanar transmission structure 34 may be formed on the opposing horizontal surface 26. Electrically conductive vias couple the electrical output of the opto-electrical device 32 to the coplanar transmission structure 34.

The electrical element 48 is preferably a gallium-arsenide semiconductor device having at least a first sampling diode 56 formed thereon forming a sampling circuit. Preferably, the semiconductor device has more than one sampling diode 56 forming the sampling circuit, such as the sampling circuit described in U.S. Pat. No. 6,292,052, titled "Output Amplifier for a Discrete Filter-Les Optical Reference Receiver". The sampling diode or diodes 56 are electrically coupled to the center conductor of the coplanar transmission structure 58 that extend from the end face 54 of the electrical element 48. The sampling diode or diodes 56 are electrically coupled to a conductive contact pad 90 formed on the top surface 50 of the electrical element 48 at the opposite end of the electrical element 48. The substantially flat electrical conductor 60 couples the sampled electrical signal from the sampling diode or diodes 56 to the additional circuitry formed on an adjacent substrate 62. Such circuitry may include amplifiers, summing circuits and the like. Electrical leads (not shown) couple electrical power and biasing voltages to the electrical element 48. As was described for the opto-electronic element 24, the electrical element 48 may be formed on one of the horizontal surfaces 50 and the coplanar transmission structure 58 may be formed on the opposing horizontal surface 50. Electrically conductive vias couple the electrical output of the electrical device 56 to the coplanar transmission structure 58.

The carriers 16 and 40 are position in an alignment mount with at least one of the carriers being linearly and rotationally moveable in the three mutually perpendicular directions relative to the other carrier. The carriers 16 and 40 are positioned to align the coplanar transmission structures 58 and 69 in a proximate abutting relationship. The lateral separation of the coplanar transmission structures 58 and 69 is in the sub-millimeter range with the preferred lateral separations being as small as possible. The coplanar transmission structures 58 and 69 are aligned such that the end face electrical element 54 and the end wall 67 of the standoff dielectric substrate 63 are parallel to each other and the coplanar transmission structures 58 and 69 lay in the same plane. Once the coplanar transmission structures 58 and 69 are aligned in the proximate abutting relationship, the carriers 16 and 40 are joined together by one of the above described securing members 66. The coplanar transmission structures 58 and 69 are then electrically coupled together using substantially flat electrical conductors 92, such as wedge bonded gold ribbon wire, bond wires or the like.

FIGS. 3A through 3X illustrate various positioning configurations for the standoff dielectric substrate or substrates 63 with the opto-electrical and electrical elements 24 and 48 in the opto-electronic assembly 10 of the present invention. Like elements of the previous drawing figures are labeled the same in FIGS. 3A through 3X. FIGS. 3A through 3L illustrate the standoff dielectric substrate 63 abutting the opto-electrical element 24, FIGS. 3M through 3R illustrate the standoff dielectric substrate abutting the electrical element 48 and FIGS. 3S through 3X illustrate separate standoff dielectric substrates abutting each of the opto-electrical and electrical elements 24 and 48. FIG. 3A shows the standoff dielectric substrate 63 abutting the opto-electrical element 24 and the electrical element 48 recessed back from the end faces 22 and 46 of the carriers 16 and 40. The total setback of the elements 63 and 48, that is the combined setback of both elements, is less than one millimeter. For example, the standoff dielectric substrate 63 may be setback 900 microns from the open end face 22 and the electrical element 48 setback 90 microns from the open end face 46. FIG. 3B illustrates the standoff dielectric substrate 63 and the electrical element 48 extending to the open end faces 22 and 46 of their respective carriers 16 and 40. FIG. 3C illustrates the standoff dielectric substrate 63 and the electrical element 48 extending past the open end faces 22 and 46 of their respective carriers 16 and 40. Any combination of these standoff dielectric substrate and electrical element positions are possible. For example, the standoff dielectric substrate may be recessed on its carrier and the other element extends to or past the open end face of its carrier or the standoff dielectric substrate extends to the open end face of its carrier and the other element extends past the open end face of its carrier.

Each opto-electrical and electrical section 12 and 14 may be provided with a mounting dielectric substrate 100. The mounting dielectric substrate has opposing horizontal surfaces 102 and an end face 104 and may be formed of a alumina-oxide material or similar non-conducting material. FIG. 3D illustrates the positioning of a mounting dielectric substrate 100 on the carrier 16 of the opto-electrical section 12 with the opto-electrical element 24 and the standoff dielectric substrate 63 secured to the mounting dielectric substrate 100. The mounting dielectric substrate 100 is shown recessed from the open end face 22 of the carrier 16 with the standoff dielectric substrate 63 extending to the end face 104 of the mounting dielectric substrate 100. The electrical element 48 is positioned on the carrier 40 of the electrical section 14 with the electrical element 48 extending to the open end face 46 of the carrier 40. FIG. 3E illustrates the positioning of the mounting dielectric substrate 100 on the carrier 40 of the electrical section 14 with the electrical element 48 secured to the mounting dielectric substrate 100. The mounting dielectric substrate 100 is shown recessed from the open end face 46 of the carrier 40 with the electrical element 48 extending to the end face 104 of the mounting dielectric substrate 100. The opto-electrical element 24 and the standoff dielectric substrate 63 are positioned on the carrier 16 of the opto-electrical section 12 with the standoff dielectric substrate 63 extending to the open end face 22 of the carrier 16. FIG. 3F illustrates the positioning of mounting dielectric substrates on each of the opto-electrical and electrical sections 12 and 14. Each substrate is shown recessed from the respective open end faces 22 ans 46 of their respective carriers 16 and 40. The standoff dielectric substrate 63 and the opto-electrical element 24 are positioned on the standoff dielectric substrate 100 and the electrical element 48 is positioned on the standoff dielectric substrate 100 with the standoff dielectric substrate 63 and the electrical element 48 extending to the end faces 104 of the respective mounting dielectric substrates 100.

Figure 3G:
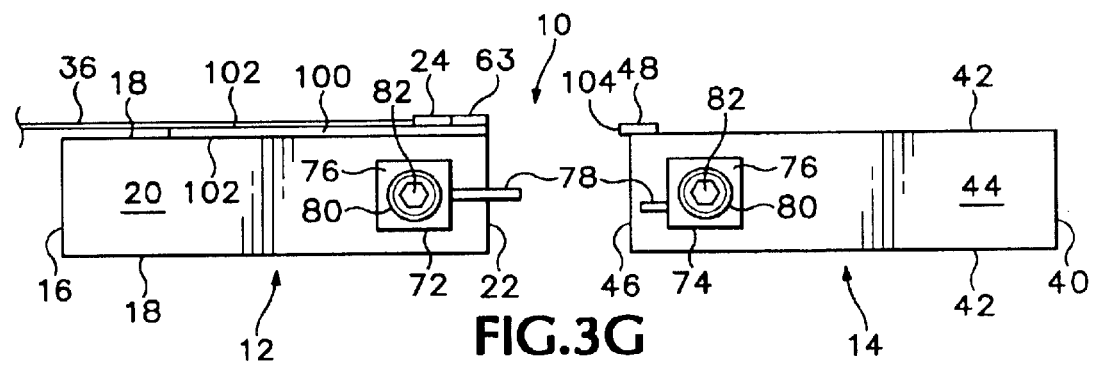
Figure 3H:
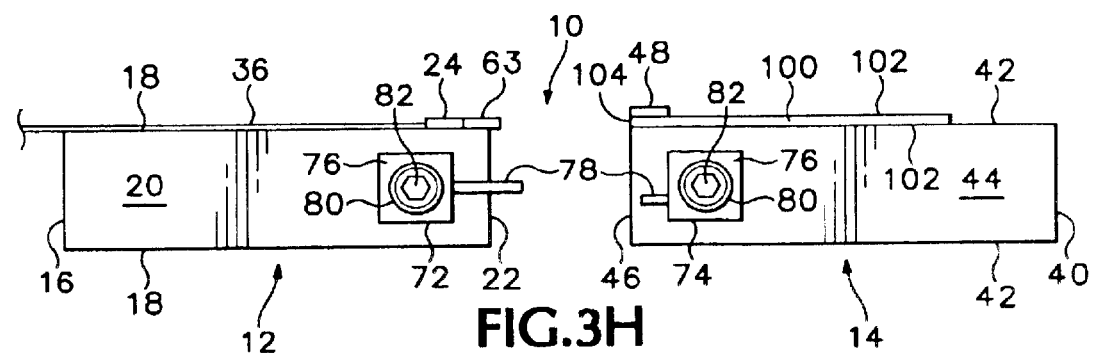
Figure 3I:
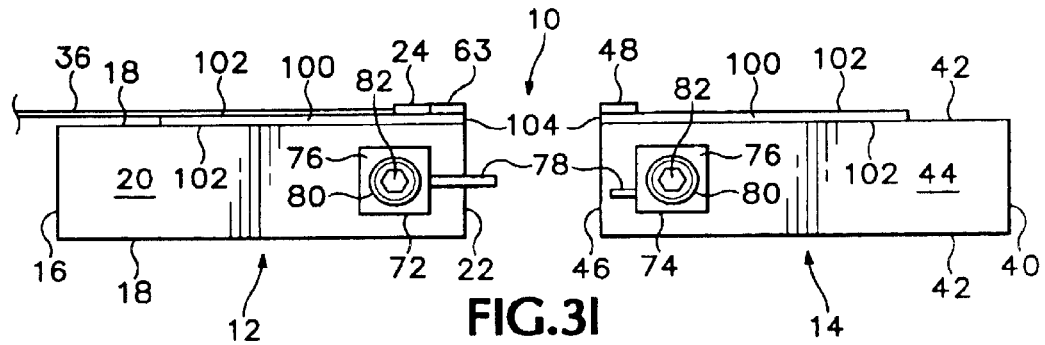

FIG. 3G illustrate the positioning of the mounting dielectric substrate 100 on the carrier 16 with the mounting dielectric substrate extending to the open end face 22 of the carrier 16. The standoff dielectric substrate 63 and the opto-electrical element 24 are positioned on the mounting dielectric substrate 100 with the standoff dielectric substrate 63 extending to the end face 104 of the dielectric substrate 100. The electrical element 48 is positioned on the carrier 40 with the electrical element extending past the open end face of the carrier 40. FIG. 3H illustrates the standoff dielectric substrate 63 and the opto-electrical elements 24 positioned on the carrier 16 with the standoff dielectric substrate 63 extending past the open end face of the carrier 16. The mounting dielectric substrate 100 is positioned on the carrier 40 and recessed from the open end face of the carrier 40. The electrical element 48 is positioned on the mounting dielectric substrate 100 and extends to the end face 104 of the mounting dielectric substrate 100. FIG. 3I illustrates mounting dielectric substrates 100 mounted on each of the carriers 16 and 40 of the opto-electrical and electrical sections 12 and 14. The end faces 104 of the mounting dielectric substrates 100 extend to the open end faces 22 and 46 of the carriers 16 and 40. The standoff dielectric substrate 63 and the opto-electrical and electrical elements 24 and 48 are secured to the respective mounting dielectric substrates 100 with the standoff dielectric substrate 63 and the electrical element 48 extending to the respective end faces 104 of the mounting dielectric substrate 100.

Figure 3J:
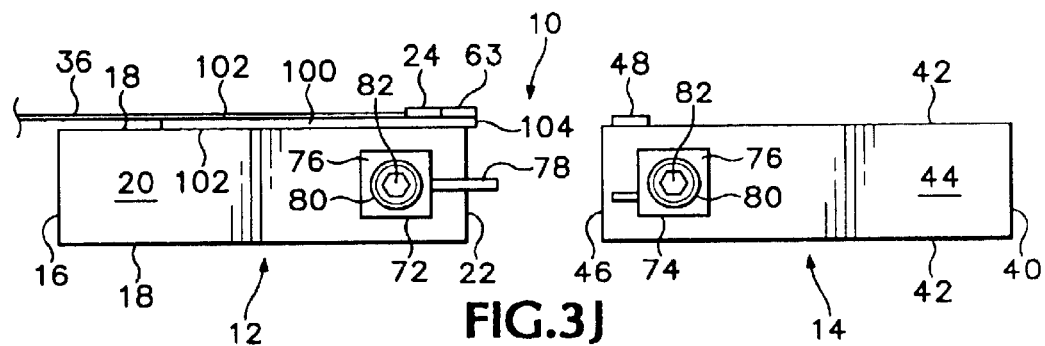
Figure 3K:
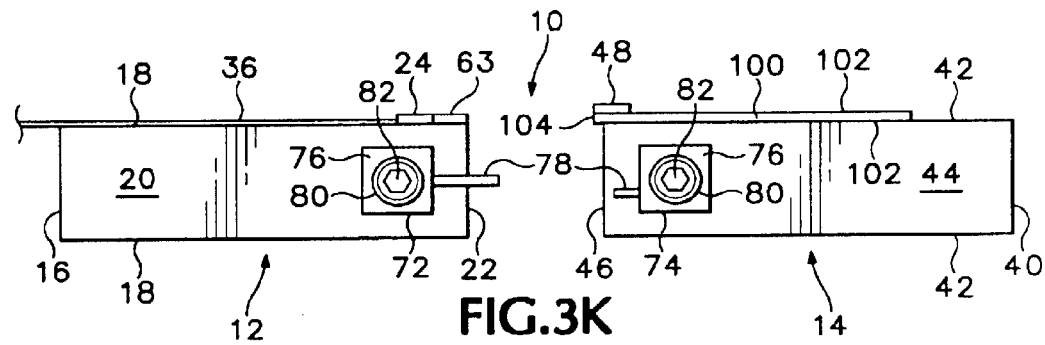
Figure 3L:
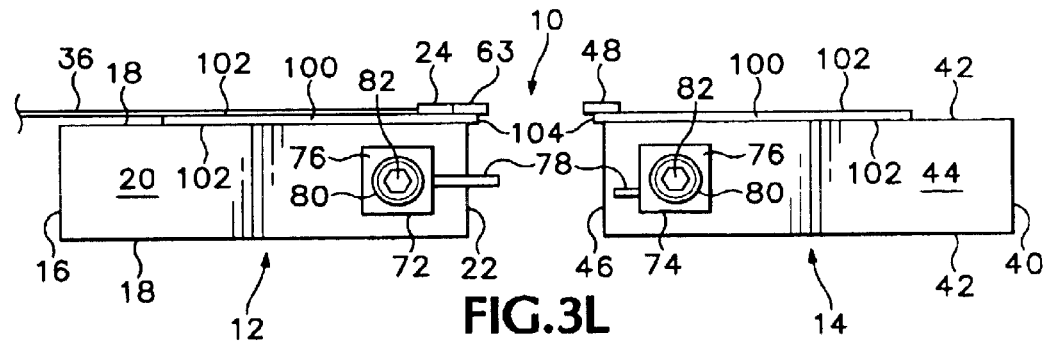

FIG. 3J illustrate the positioning of the mounting dielectric substrate 100 on the carrier 16 with the mounting dielectric substrate extending past the open end face 22 of the carrier 16. The standoff dielectric substrate 63 and opto-electrical element 24 are positioned on the mounting dielectric substrate 100 with the standoff dielectric substrate 63 extending to the end face 104 of the dielectric substrate 100. The electrical element 48 is positioned away from the open end face 46 of the carrier 40. FIG. 3K illustrate the positioning of the mounting dielectric substrate 100 on the carrier 40 with the mounting dielectric substrate extending past the open end face 46 of the carrier 40. The electrical element 48 is positioned on the mounting dielectric substrate 100 with the electrical element 48 extending to the end face 104 of the dielectric substrate 100. The standoff dielectric substrate 63 and the opto-electrical element 24 are positioned on the carrier 16 with the standoff dielectric substrate 63 extending to the open end face 22 of the carrier 16. FIG. 3L illustrates mounting dielectric substrates 100 mounted on each of the carriers 16 and 40 of the opto-electrical and electrical sections 12 and 14. The end faces 104 of the mounting dielectric substrates 100 extend past the open end faces 22 and 46 of the carriers 16 and 40. The standoff dielectric substrate 63 and the opto-electrical element are secured to the mounting dielectric substrate 100 on the carrier 16 with the standoff dielectric substrate 63 extending past the end face of the mounting dielectric substrate 100. The electrical element 48 is secured to the mounting dielectric substrates 100 on the carrier 40 with the electrical element 48 extending past the end face 104 of the mounting dielectric substrate 100.

Figure 3M:
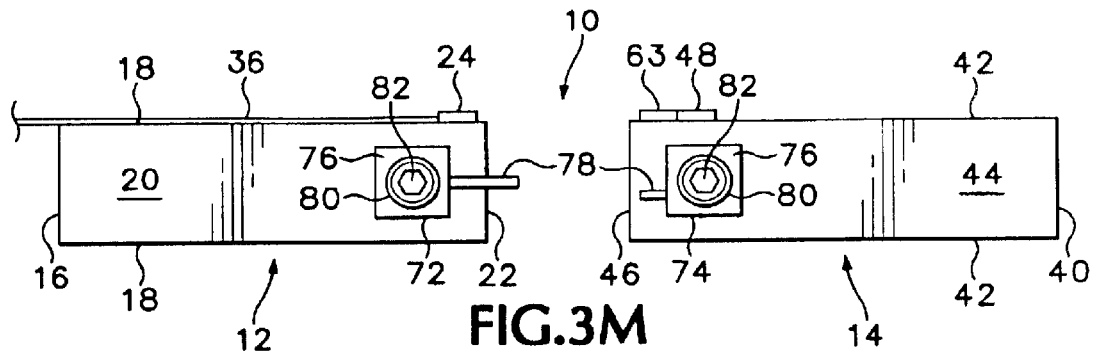
Figure 3N:
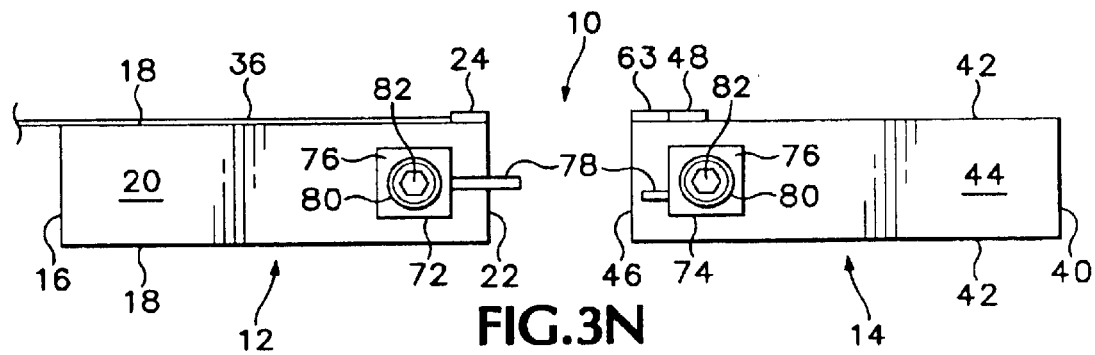
Figure 3O:
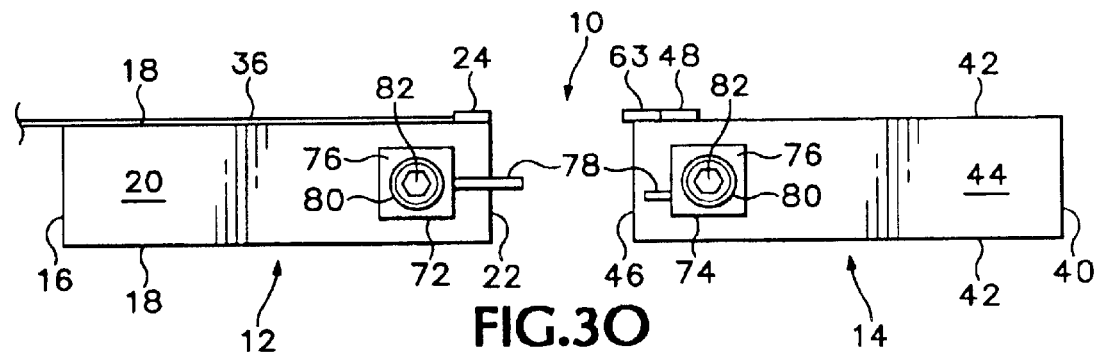

FIGS. 3M–3O illustrate the standoff dielectric substrate 63 abutting the electrical element 48 and positioned on the carrier 40. In FIG. 3M, the standoff dielectric substrate 63 and the electrical element 48 are recessed back from the open end face 46 of the carrier 40 and the opto-electrical element 24 on the carrier 16 is recessed back from the open end face 22 of the carrier 16. In FIG. 3N, the standoff dielectric substrate 63 extends to the open end face 46 of the carrier 40 and the opto-electrical element 24 extends to the open end face 22 of the carrier 16. In FIG. 3O, the standoff dielectric substrate 63 extends past the open end face 46 of the carrier 40 and the opto-electrical element 24 extends to the open end face 22 of the carrier 16.

Figure 3P:
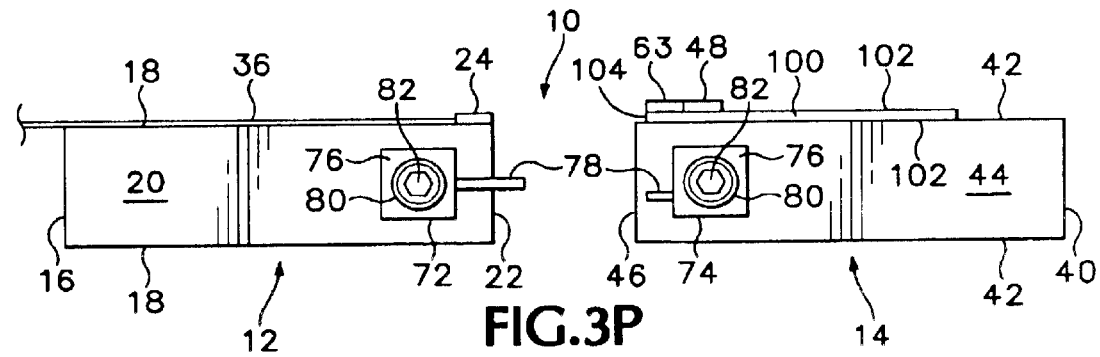
Figure 3Q:
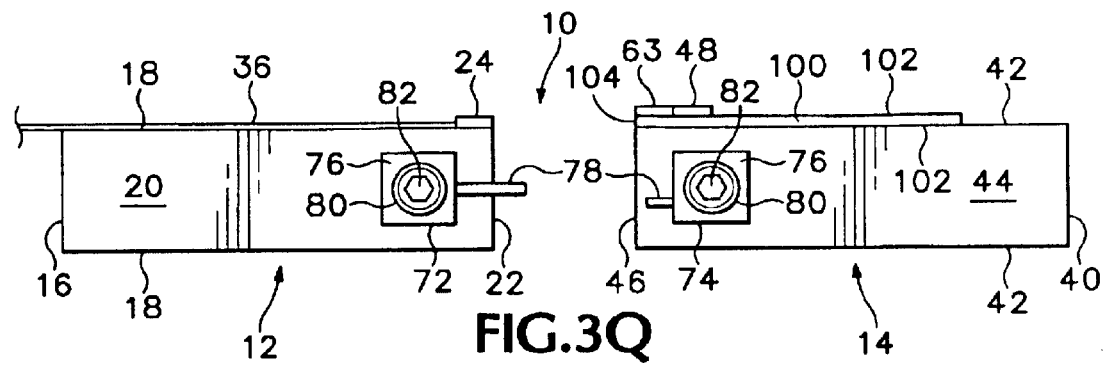
Figure 3R:
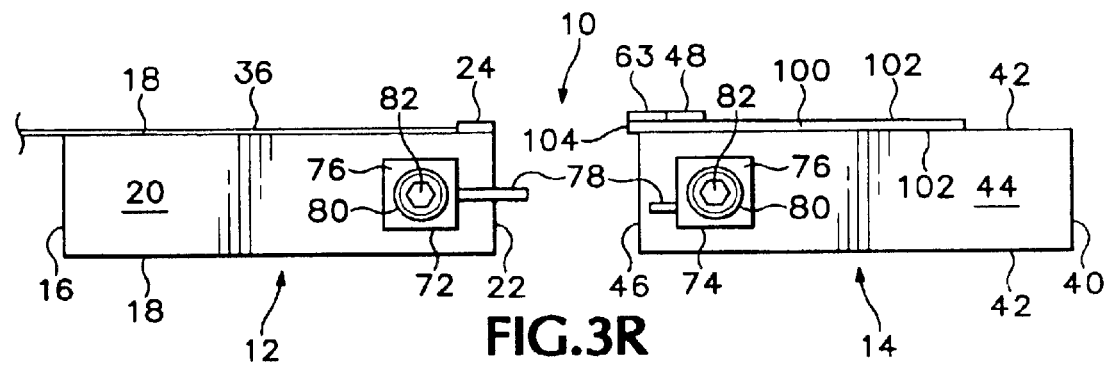

FIGS. 3P–3R illustrate a mounting dielectric substrate 100 positioned on the carrier 40 with the standoff dielectric substrate 63 and the electrical element 48 positioned on the mounting dielectric substrate 100. In each figure, the standoff dielectric substrate 63 extends to the end face 104 of the mounting dielectric substrate 100 and the opto-electrical element 24 on carrier 16 extends to the open end face 22 of the carrier 16. In FIG. 3P, the standoff dielectric substrate 63 and the supporting mounting dielectric substrate 100 are recessed back from the open end face 46 of the carrier 40. In FIG. 3Q, the standoff dielectric substrate 63 and the supporting mounting dielectric substrate 100 extend to the open end face 46 of the carrier 40. In FIG. 3R, the standoff dielectric substrate 63 and the supporting mounting dielectric substrate 100 extend past the open end face 46 of the carrier 40.

Figure 3S:
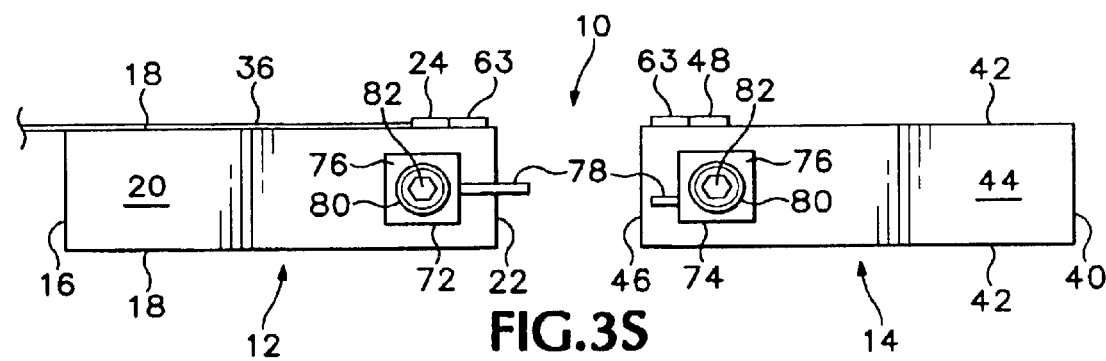
Figure 3T:
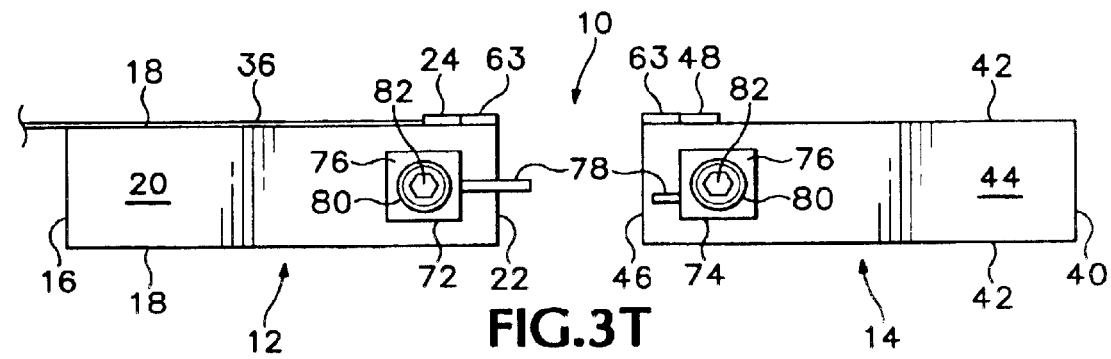
Figure 3U:
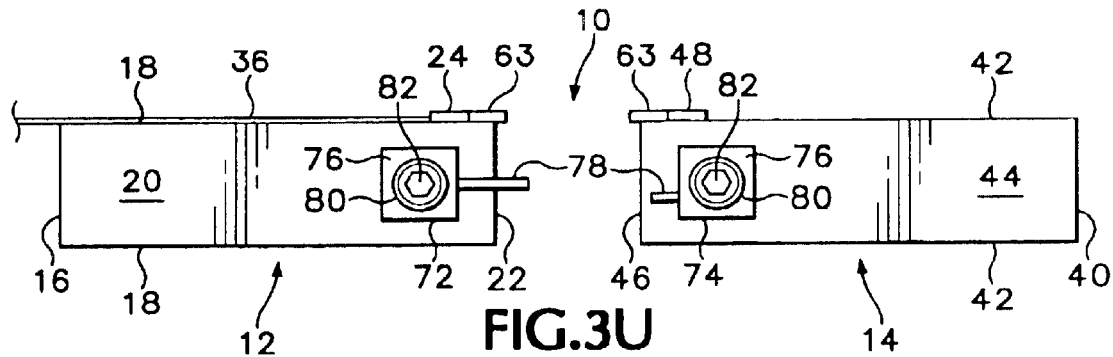
Figure 3V:
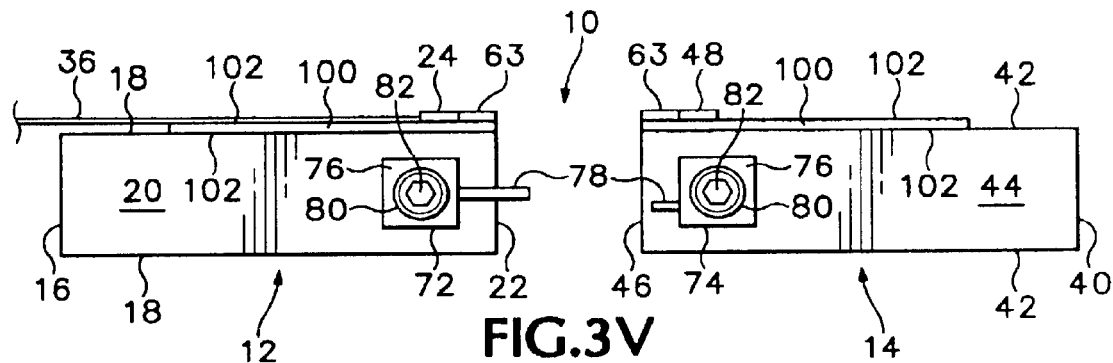
Figure 3W:
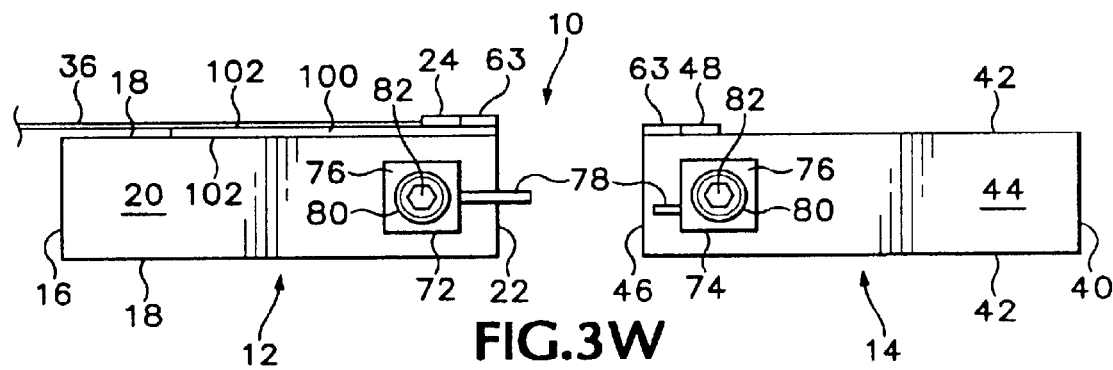
Figure 3X:
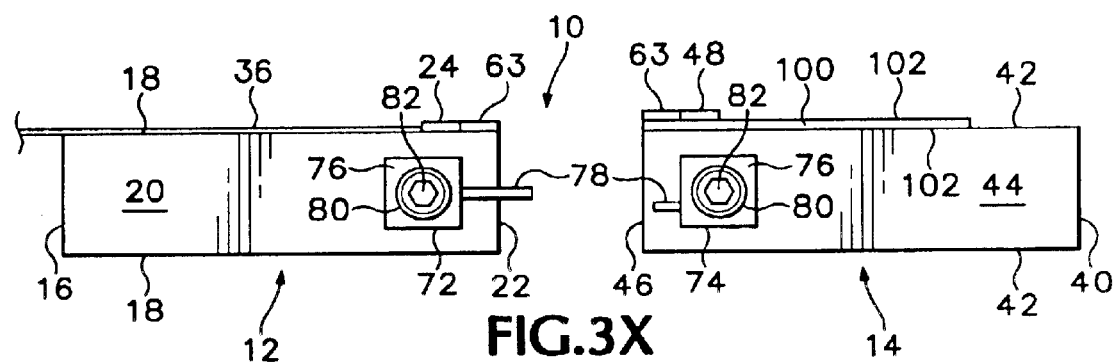

FIGS. 3S–3X illustrate standoff dielectric substrates 63 abutting both the opto-electrical and electrical elements 24 and 48. In FIG. 3S, the standoff dielectric substrates 63 are recessed back from the open end faces 22 and 46 of the respective carriers 16 and 40. In FIG. 3T, the standoff dielectric substrates 63 extend to the open end faces 22 and 46 of the respective carriers 16 and 40. In FIG. 3U, the standoff dielectric substrates 63 extend past the open end faces 22 and 46 of the respective carriers 16 and 40. In FIG. 3V, mounting dielectric substrates 100 are positioned on the carriers 16 and 40 adjacent to the open end faces 22 and 46 of the carriers 16 and 40. The standoff dielectric substrates 63 and their abutting opto-electrical and electrical elements 24 and 48 are positioned on the respective mounting dielectric substrates 100 with the standoff dielectric substrates 63 extending to the end faces 104 of the substrates 100. In FIG. 3W, a mounting dielectric substrate 100 is positioned on the carrier 16 with the opto-electrical elements 24 and the standoff dielectric substrate 63 positioned on the mounting dielectric substrate 100. The standoff dielectric substrate 63 extends to the end face 104 of the mounting dielectric substrate 100. The standoff dielectric substrate 63 and the electrical element 48 are positioned on the carrier 40 with the standoff dielectric substrate 63 extending to the open end face 46 of the carrier 40. In FIG. 3X, a mounting dielectric substrate 100 is positioned on the carrier 40 with the electrical element 48 and the standoff dielectric substrate 63 positioned on the mounting dielectric substrate 100. The standoff dielectric substrate 63 extends to the end face 104 of the mounting dielectric substrate 100. The standoff dielectric substrate 63 and the opto-electrical element 24 are positioned on the carrier 16 with the standoff dielectric substrate 63 extending to the open end face 22 of the carrier 16.

The above illustrated examples of the positioning of one or more standoff dielectric substrates 63 that abut the opto-electrical and electrical elements 24 and 48 on the carriers 16 and 40 and the positioning of one or more mounting dielectric substrates 100 on the carriers 16 and 40 and the positioning of the standoff dielectric substrate or substrates 63 and the opto-electrical and electrical elements 24 and 48 on the mounting dielectric substrates 100 represent some but not all of the possible positioning configuration for the opto-electronic assembly 10. Each of the positioning locations for the standoff dielectric substrate 63 and the opto-electrical and electrical elements 24 and 48 relative to open end faces of the carriers 16 and 40 may equally be used in positioning the standoff dielectric substrate or substrates 63 and the opto-electrical and electrical elements 24 and 48 on the mounting dielectric substrate or substrates 100. Each of the positioning locations of the mounting dielectric substrate or substrates 100 may be used in conjunction with each opto-electrical and electrical section 12 and 14 or with both of the sections 12 and 14.

Figure 4:
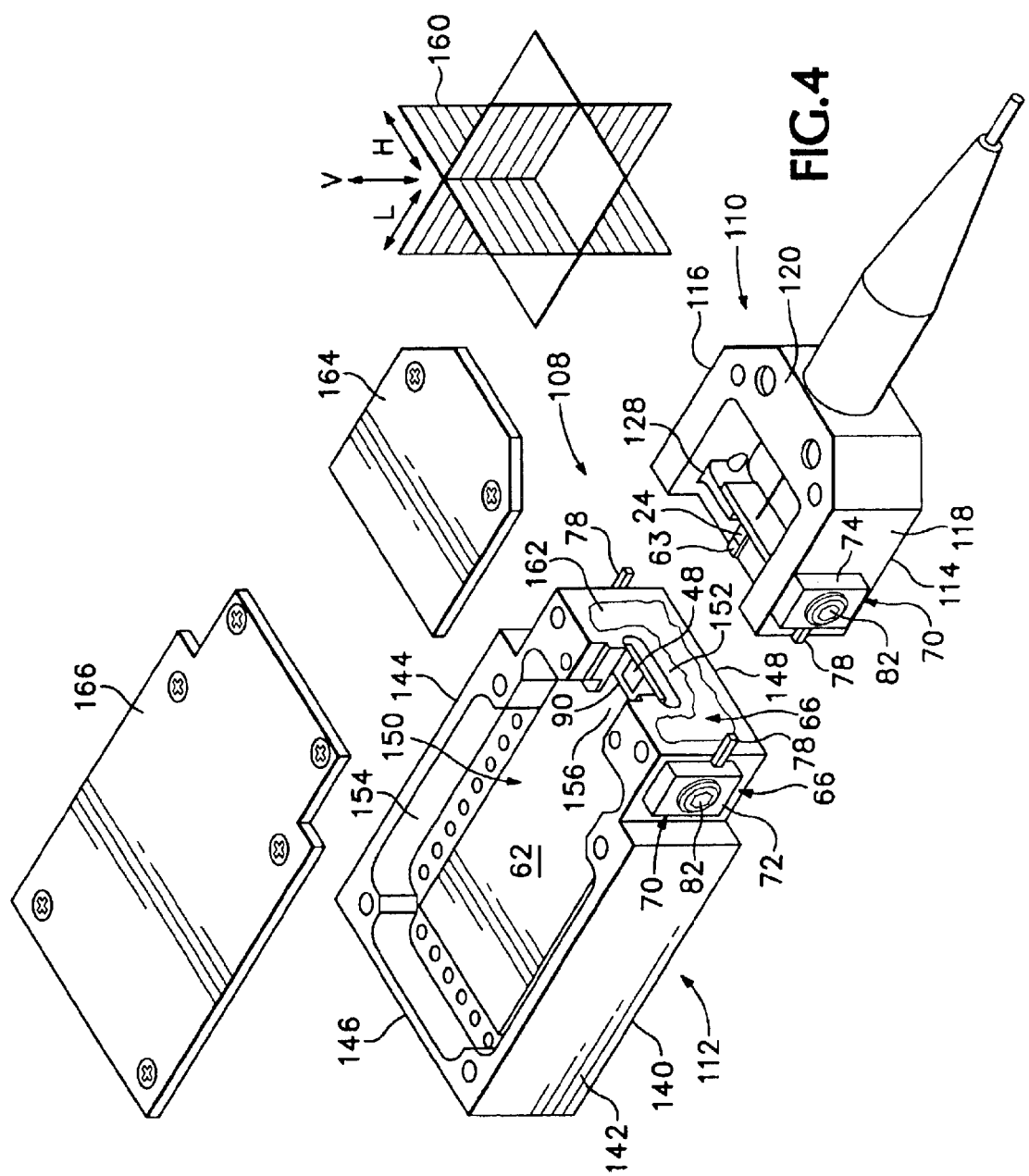
FIG. 4 is a perspective view of a second embodiment of a butt joined electronic module having a standoff dielectric substrate according to the present invention.

Referring to FIG. 4, there is shown a perspective view of a second embodiment of the butt joined opto-electronic assembly and module 108 of the present invention. The butt joined opto-electronic module 108 has an opto-electrical section or module 110 and an electrical section or module 112. The opto-electrical module 110 has a housing 114 having sidewalls 116 and 118 and end walls 120 and 122 forming a cavity 124 within the housing 114 as shown in the perspective view of the opto-electrical housing 114 in FIG. 5. The housing 114 is preferably made of metal, such as brass or the like. Alternately, the housing may be made of solid materials, such as plastic, glass or the like. The cavity 124 is bounded on three sides by the sidewalls 116 and 118 and one of the end walls 120. The cavity 124 intersects the other end wall 122 defining an open end face 126 on the housing 114. Opposing support members 128 extend part way into the cavity 124 from the sidewalls 116 and 118 forming a gap 130 there between that supports an optical waveguide alignment member 132. The alignment member 132 had an aperture 134 formed therein that receives an optical waveguide 136 in the form of an optical fiber. The optical fiber 136 extends through an aperture 138 formed in the bounding end wall 122 of the cavity 124.

The standoff dielectric substrate 63 is positioned in the cavity 124 toward the open end face 126 and abuts the opto-electrical element 24. The standoff dielectric substrate 63 has the same structure as previously described with the coplanar transmission structure 69 extending to the end walls 67 of the standoff dielectric substrate 63. The opto-electrical element 24 has the same structure and elements as previously described with the opto-electrical element 24 having the coplanar transmission structure 34 formed on one of the horizontal surfaces 26 of the opto-electrical element 24. Substantially flat electrical conductors 94 electrically couple the coplanar transmission structures 34 and 69 together. The optical fiber 136 is optically aligned with the opto-electrical device 32 formed on the opto-electrical element 24. Once the optical fiber 136 is aligned with the opto-electrical device 32, the alignment member 132 is secured to the support members 128. As previously stated, the optical waveguide 136 may be formed as part of a substrate 38 that is aligned with the opto-electrical device 32. The optical fiber is then optically aligned with the substrate optical waveguide 136.

The electrical module 112 has a housing 140 having sidewalls 142 and 144 and end walls 146 and 148 forming a cavity 150 within the housing 140. The housing 140 is preferably made of metal, such as brass or the like. Alternately, the housing 140 may be made of solid materials, such as plastic, glass or the like The cavity 150 is bounded on three sides by the sidewalls 142 and 144 and one of the end walls 146. The cavity 150 intersects the other end wall 148 defining an open end face 152 on the housing 140. In the preferred embodiment, the cavity 150 transitions from a larger cavity area 154 to a smaller cavity area 156 that intersects the open end face 152 of the housing 140. The transition allows the joining of the opto-electrical module 110 to the electrical module 112. The electrical element 48 is positioned in the smaller cavity area 156 adjacent to the open end face 152 of the housing 140. The electrical element 48 has the same structure and elements as previously described with the electrical device 56 and coplanar transmission structure 58 formed on one of the horizontal surfaces 50 of the electrical element 48. The substantially flat electrical conductor 60 couples the sampled electrical signal from the sampling diode or diodes to additional circuitry formed on the adjacent substrate 62. Such circuitry may include amplifiers, summing circuits and the like.

The housings 114 and 140 of the opto-electrical and electrical modules 110 and 112 are linearly and rotationally positionable relative to each other in three mutually perpendicular planes as represented by the mutually orthogonal planes 160. The modules 110 and 112 are moveable up-and-down in the vertical direction, side-to-side in the horizontal direction and in-and-out in the lateral direction. The opto-electrical and electrical modules 110 and 112 are joined together as a single opto-electronic module with the securing members 66 previously described for the carrier members 16 and 40. An adhesive 162, such as an epoxy or UV cured epoxy, may be applied to the open end faces 126 and 152 of the housings 114 and 140 to secure then together. Preferably, the modules 110 and 112 are joined together by the removable mechanical attachment members 70 that are mounted on the exterior of the sidewalls 118, 140 and 116 and 144 of the housings 114 and 140. The two sets of attachment member links 72, 74 are mounted to the sidewalls 118, 140 and 116 and 144 adjacent to the open end faces 126 and 152 of the respective housings 114 and 140 with threaded screws 82. At least one of the extension members 78 of each of the link sets 72, 74 extends from the base 76 past the open end face 126, 152 of its housing 114 and 140. The other extension member 78 extends outward from the base 76 toward the open end face 126, 152 of its housing 114, 140. The other extension member may also extend past the open end face of its housing. As the two housings 114 and 140 are positioned together to align the coplanar transmission structures 58 and 69, the extension members 78 overlap each other. Once the coplanar transmission structures 58 and 69 are aligned, the extension members 78 are secured together to mechanically join the carriers together as one assembly.

The alignment of the coplanar transmission structures 69 and 58 on the standoff dielectric substrate 63 and electrical element 48 and the joining of the housing 114 and 140 to form a single opto-electronic module 108 are the same as was described for the aligning the coplanar transmission structures 69 and 58 on the standoff dielectric substrate 63 and electrical element 48 and joining the carriers 16 and 40 together as one assembly 10 shown in FIG. 2. The housings 114 and 140 are position in an alignment mount with at least one of the housings being linearly and rotationally moveable in the three mutually perpendicular directions relative to the other housing. The housings 114 and 140 are positioned to align the coplanar transmission structures 69 and 58 in a proximate abutting relationship. The coplanar transmission structures 69 and 58 are aligned such that the end faces 67 and 54 of the standoff dielectric substrate 63 and electrical element 48 are parallel to each other and the coplanar transmission structures 69 and 58 lay in the same plane. Once the coplanar transmission structures 69 and 58 are aligned in the abutting relationship, the housings 114 and 140 are joined together by one of the above described securing members 66. The coplanar transmission structures 69 and 58 are then electrically coupled together using substantially flat electrical conductors 92, such as wedge bonded gold ribbon wire, bond wires or the like. Each housing 114 and 140 may be fitted with a removable cover 164, 166 that is secured to the respective sidewalls and end wall defining each of the cavities 124 and 150 to prevent stray signals from interfering with the electrical signals of the opto-electronic module 10 and to prevent foreign materials from entering the module. Alternately, the individual covers 164 and 166 may be combined into a single removable cover that is secured to the sidewalls and end walls defining the cavities 124 and 150.

Figure 6:
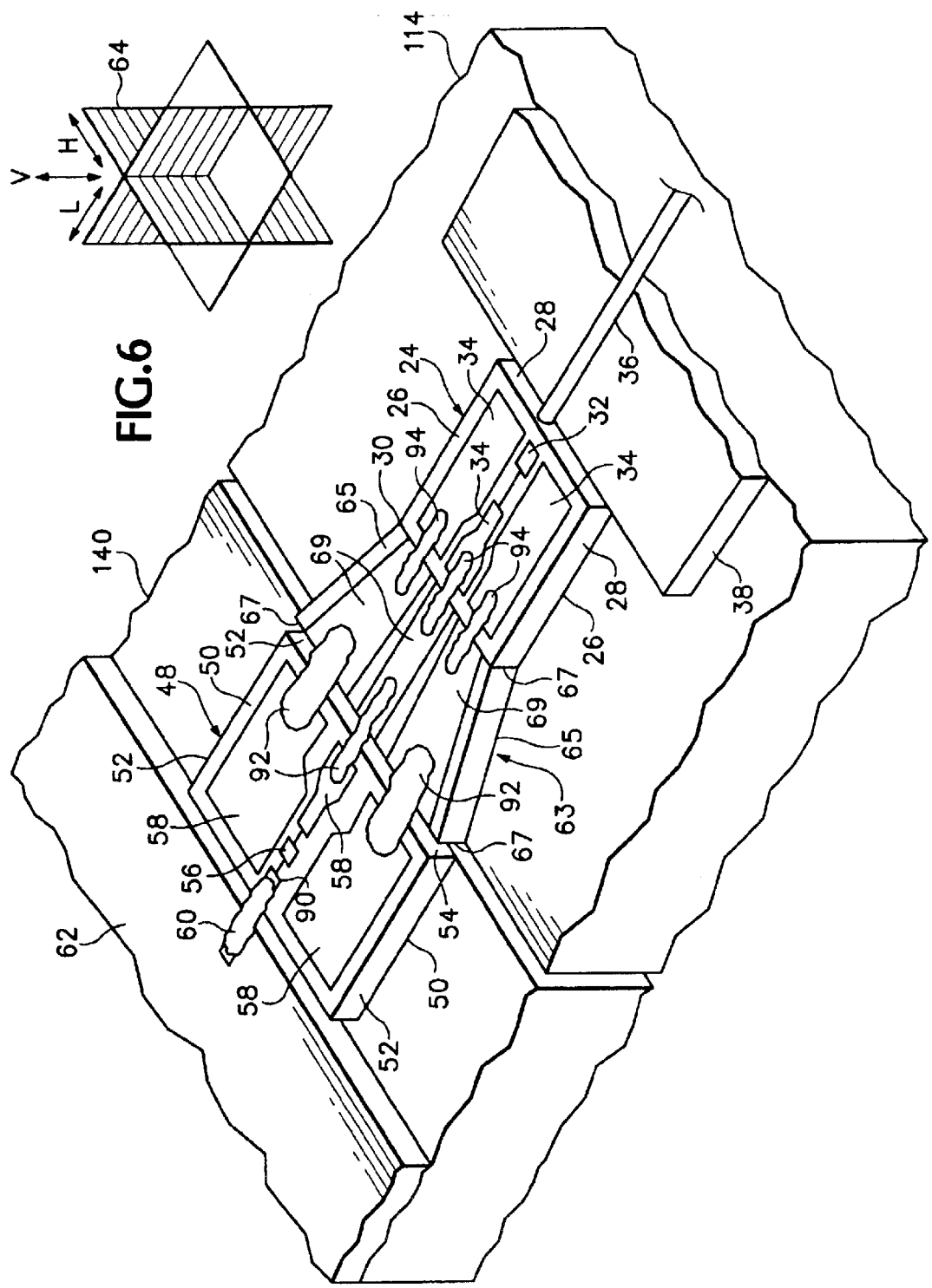
FIG. 6 is a detailed perspective view of the standoff dielectric substrate joining dimensionally mismatched coplanar transmission structures of the butt joined electronic assembly and module according to the present invention.

FIG. 6 is a closeup perspective view of the butt joined interface between the housing 114 and 140 and the coplanar transmission structures 34, 58 and 69 where the coplanar transmission structures 34 and 58 are dimensionally mismatched. Like elements from the previous drawings are labeled the same in FIG. 6. The coplanar transmission structure 69 at the opposing end walls 67 of the standoff dielectric substrate 63 matches the dimensions of the coplanar transmission lines 34 and 58 formed on the opto-electrical and electrical elements 24 and 48. Between the opposing end walls 67, the each of the planar structures coplanar transmission structure 69 dimensionally transitions from one coplanar transmission structure dimension to the other coplanar transmission structure dimension. Different dimensioned electrical conductors corresponding to the dimensions of the different sized coplanar transmission structures electrically coupled the coplanar transmission structures together.

The positioning of the standoff dielectric substrate or substrates 63 and the opto-electrical and electrical elements 24 and 48 in the cavities 124 and 150 of the housings 116 and 140 of the opto-electronic module 108 are the same as described for the positioning of the standoff dielectric substrate or substrates and the opto-electrical and electrical elements 24 and 48 on the carriers 16 and 40 of the opto-electronic assembly 10 as representatively illustrated in the examples of FIGS. 3A through 3X. The standoff dielectric substrates or substrates 63 associated with one or both of the opto-electrical and electrical elements 24 and 48 and the other of the opto-electrical and electrical elements 24 and 48 not having a standoff dielectric substrate are positionable away from the open end faces 126 and 152 of the housings 114 and 140, or extend to or extend past the open end faces 126 and 152 of the housings 114 and 140. The standoff dielectric substrate or substrates 63 and the opto-electrical and electrical elements 24 and 48 may also be secured to the mounting dielectric substrates 100 that are positioned in the respective cavities 124 and 150 of the housings 114 and 130 as previously described. A single mounting dielectric substrate 100 may be mounted in one or the other of the cavities 124 and 150 or mounting dielectric substrates 100 may be mounted in both of the cavities 124 and 150. The single mounting dielectric substrate or the multiple mounting dielectric substrates may be positioned away from the open end faces 126 and 152 of the housings 114 and 140, or the substrate or substrates may extend to the open end faces 126 and 152 of the housings 114 and 140, or extend past the open end faces 126 and 152 of the housings 114 and 140. Each of the positioning locations for the standoff dielectric substrate or substrates 63 and the opto-electrical and electrical elements 24 and 48 in the cavities 124 and 140 may equally be used in positioning the standoff dielectric substrate or substrates 63 and the opto-electrical and electrical elements 24 and 48 on the mounting dielectric substrate 100. Each of the positioning locations of the mounting dielectric substrate 100 may be used in conjunction with each opto-electrical and electrical modules 110 and 112 or with both of the sections 110 and 112.

The opto-electronic assembly and module 10 and 108 has been described with the standoff dielectric substrate or substrates 63 and the opto-electrical and electrical elements 24 and 48 positioned on the carriers 16 and 40 or in the cavities 124 and 150 of the housings 114 and 140. At least one of the standoff dielectric substrate or substrates 63 and one of the opto-electrical and electrical elements 24 and 48 are disposed adjacent to one of the open end faces 22 and 46 of the carriers 16 and 40 and the open end faces 126 and 152 of the housing 114 and such that the end wall 67 of the standoff dielectric substrate 63 and the end face 30, 54 of the opto-electrical or electrical element 24, 48 have a submillimeter lateral separation. Preferably the lateral separation is kept as small as possible to minimize the inductive and capacitive effects of the substantially flat electrical conductors 92 connecting the coplanar transmission structures 69 and 34 or 58. However, additional inductance may be needed to compensate for electrical characteristics of the standoff dielectric substrate 63 and the opto-electrical and electrical elements 24 and 48. In this instance, the separation between the coplanar transmission line structures 69 and 34 or 48 may be increased to increase the length of the connecting electrical conductors 92.

Referring to FIG. 7, there is shown a perspective view of the housings 114, 140 of the opto-electronic module 108 illustrating in greater detail the removable mechanical attachment members 70. Like elements from previous drawing figures are labeled the same. Orthogonal channels 300, 302 are preferably formed in the sidewalls 116, 118, 142, 144 of each of the housings 114, 140 adjacent to the respective open end faces 126, 152 with the horizontal channels 302 extending to the open end faces. A threaded aperture 304 is formed at the intersection of the orthogonal channels 300, 302. FIG. 8 illustrates various views of one embodiment of the links 72, 74 of the removable attachment members 70 that are secured to the sidewall 116, 118, 142, 144. Each link 72, 74 has a base 76 having a front 306, a back 308 and sides 310 with extension members 78A, 78B, 78C extending from one of the sides 310 of the base 76. The extension members 78A, 78b and 78C may be plated with a layer of tin-lead to aid in soldering the extension members together. Two extension member 78A, 78B are closer together than a third member 78C with the closely spaced extension members 78A, 78B being thinner than the third extension member 78C. The base 76 has two coaxially aligned bores 312, 314 formed therein with the first bore 312 extending into the base 76 from the front 306 and having a larger diameter than the second bore 314 that extends through the base 76 to the back 308. The larger sized bore 312 receives the head of the threaded cap screw 82 with the shank of the screw extends through the second bore 314. The threads of the screw 82 engage the threaded aperture 304 in one of the sidewalls 116, 118, 142, 144 of the housings 114, 140. The back 308 of the base 76 has pedestal feet 316 extending toward the second bore 314 in the base. Each of the pedestal feet 316 bisects one of the sides 310 of the base 76. Two of the pedestal feet 316 engage one of the horizontal channels 302 formed in the sidewalls 116, 118, 142, 144 of the housings 114, 140 and two of the pedestal feet 316 engage the associated vertical channel 300 formed in the sidewalls 116, 118, 142, 144 of the housings 114, 140. The depth of the pedestal feet 316 may be greater than the depth of the channels 300, 302 to prevent the total surface of the back 308 of the base 76 from touching the sidewalls 116, 118, 142, 144 of the housings 114, 140. This prevents the links 72, 74 from transferring excessive heat to the housing 114, 140 during the soldering of the extension members 78A, 78B, 78C. The positioning of the extension members 78A, 78B, 78C on the side 310 of the base 76 allows one link design to be used on both housings 114, 140. For example, the link 72 on the electrical module 112 has the closely spaced extension members 78A, 78B positioned toward the top of the housing 140 and the thicker extension member 78C toward the bottom of the housing 140. The link 74 on the opto-electrical module 110 has the thicker extension member 78C toward the top of the housing 114 and the two closely spaced extension members 78A, 78B toward the bottom of the housing 114. When the two housing 114, 140 are brought together, the thicker extension member 78C on the link 72 secured to the electrical module 112 extends in between the two closely spaced extension members 78A, 78B on the link 74 secured to the opto-electrical module 110. Likewise, the thicker extension member 78C on the link 74 secured to the opto-electrical module 110 extends in between the two closely extension members 78A, 78B on the link 72 secured to the electrical module 112. FIG. 9 is a perspective view of the opto-electrical module 110 and the electrical module 112 joined together as an opto-electronic module 108. The modules 110, 112 have been positioned to align the coplanar transmission structures. The extension members 78A, 78B, 78C of the links 72, 74 are overlapped and secured together with solder, an adhesive, such as epoxy or a low melting temperature metal with strong adhesion like indium 318. The amount of extension member overlap is preferably 0.040 inches. A single cover 320 is secured to the opto-electrical and electrical modules 110 and 112 to prevent foreign material from entering the opto-electrical module 108 and to prevent stray signals from interfering with the electrical signals of the opto-electronic module 108.

FIG. 10 shows a further embodiment for the links 72, 74 of the removable mechanical attachment members 70. Like elements from the previous drawing figures are labeled the same. Each link 72, 74 has a base 76 with front 306, back 308 and sides 310. The base 76 has two coaxially aligned bores 312, 314 formed therein with the first bore 312 extending into the base 76 from the front 306 and having a larger diameter than the second bore 314 that extends through the base 76 to the back 308. The larger sized bore 312 receives the head of the threaded cap screw 82 with the shank of the screw extends through the second bore 314. Two parallel recessed channels 320 are formed in the back 308 of the base 76 defining two ribs 322, 324 adjacent to two of opposing sides and a central platform 326 of equal height with the ribs 322, 324. Two axially aligned pedestal feet 316 are formed on the central platform 326 extending from the other opposing sides 310 toward the second bore 314 in the base. The pedestal feet 316 engage one of the horizontal channels 302 formed in the sidewalls 116, 118, 142, 144 of the housings 114, 140.

The closely spaced extension members 78A, 78B extending from one of the sides of the links 72, 74 are replaced with a solid extension member 330 having tangs 332 extending in a perpendicular direction from the solid extension member 330 toward the front of the base. The thicker extension member 78C is still retained in the embodiment. When the two housing 114, 140 are brought together, the thicker extension member 78C on the link 72 secured to the electrical module 112 extends in between the two tangs on ths solid extension member on the link 74 secured to the opto-electrical module 110. Likewise, the thicker extension member 78C on the link 74 secured to the opto-electrical module 110 extends in between the two tangs on the solid extension member on the link 72 secured to the electrical module 112. The overlapping extension members 330 and 78C are secured together with solder or the like. The ribs and central platform prevent the total surface of the back 308 of the base 76 from touching the sidewalls 116, 118, 142, 144 of the housings 114, 140. This prevents the links 72, 74 from transferring excessive heat to the housing 114, 140 during the soldering of the extension members 330 and 78C.

Various embodiments of a butt joined opto-electronic assembly and module have been described with the various embodiments providing an apparatus that allows independent aligning in a proximate abutting relationship and electrical coupling of coplanar transmission structures formed on one or more standoff dielectric substrates and associated opto-electrical and electrical elements that are secured on respective independently positioned and mechanically joined open end face carriers or housings. The standoff dielectric substrate or substrates and the other of the opto-electrical and electrical element are positionable relative to the open end face of the carrier and housing. Each element and standoff dielectric substrate may be positioned away from the open end face, extend to the open end face, or extend past the open end face with the lateral separation between the proximate abutting coplanar transmission structures of the standoff dielectric substrate or substrates and the other of the opto-electrical and electrical elements being less than one millimeter. Each carrier or housing may also include a mounting dielectric substrate on which is secured one of the standoff dielectric substrate or substrates and the opto-electrical and electrical elements. Each mounting dielectric substrate may be positioned away from the open end face of the carrier or housing, extend to the open end face of the carrier or housing, or extend past the open end face of the carrier or housing. Each element or standoff dielectric substrate or substrates may be positioned away from the end face of its mounting dielectric substrate, extend to the end face of its mounting dielectric substrate, or extend past the end face of its mounting dielectric substrate. The carriers and housing are linearly and rotationally positionable relative to each other in three mutually perpendicular planes to align the coplanar transmission structures in the proximate abutting relationship. Securing members mounted on the carriers and housing mechanically couple the carriers and housing together as a single assembly or module. The coplanar transmission structures are electrically coupled together using substantially flat electrical conductors.

It will be obvious to those having skill in the art that many changes may be made to the details of the above-described embodiments of this invention without departing from the underlying principles thereof. The scope of the present invention should, therefore, be determined only by the following claims.

What is claimed is:

1. A butt joined opto-electronic assembly for millimeter wavelength frequencies comprising:

a first carrier having an open end face and an opto-electrical element positioned on the carrier with the opto-electrical element having an end face and at least a first horizontal surface with an opto-electrical device formed on the horizontal surface and coupled to receive an optical signal from an optical waveguide secured to the carrier;

a second carrier having an open end face and an electrical element positioned on the carrier with the electrical element having an end face and at least a first horizontal surface with an electrical device formed on the horizontal surface;

first and second coplanar transmission structures with one of the coplanar transmission structures formed on at least one horizontal surface of the opto-electrical element and the other coplanar transmission structure formed on at least one horizontal surface of the electrical element with each of the first and second coplanar transmission structures being electrically coupled to one of the respective opto-electrical and electrical devices;

at least a first standoff dielectric substrate having opposing vertical end walls and at least one horizontal surface with a coplanar transmission structure formed on at least horizontal surface and extending to the vertical end walls with one of the vertical end walls of the standoff dielectric substrate abutting the end face of one of the opto-electrical and electrical elements, the coplanar transmission structure of the abutting opto-electrical and electrical element and the coplanar transmission structure on the standoff dielectric substrate being coplanar and electrically coupled via substantially flat electrical conductors with the coplanar transmission structure of the standoff dielectric substrate and the coplanar transmission structure of the other element of the opto-electrical and electrical elements being independently aligned in three mutually perpendicular planes and in a proximate abutting relationship;

the first and second carriers being independently positioned in a proximate abutting relationship at the open end faces and mechanically joined together as a single assembly by a securing member with the first and second carriers being linearly and rotationally positionable in three mutually perpendicular planes relative to each other to align the coplanar transmission structures of the standoff dielectric substrate and the other element of the opto-electrical and electrical elements; and substantially flat electrical conductors electrically coupling the coplanar transmission structures of the standoff dielectric substrate and the other element of the opto-electrical and electrical elements together.

2. The butt joined opto-electronic assembly as recited in claim 1 wherein coplanar transmission structures of the standoff dielectric substrate and the other element of the opto-electrical and electrical elements have sub-millimeter lateral separation.

3. The butt joined opto-electronic assembly as recited in claim 1 further comprising at least a first mounting dielectric substrate having an end face, with the first mounting dielectric substrate mounted on at least one of the open end face carriers and having one of the standoff dielectric substrate and abutting one of the opto-electrical and electrical elements and the other of the opto-electrical and electrical elements positioned thereon.

4. The butt joined opto-electronic assembly as recited in claim 3 further comprising at least a second mounting dielectric substrate having an end face, with the second mounting dielectric substrate mounted on the other open end face carrier having the other one of the standoff dielectric substrate and abutting one of the opto-electrical and electrical elements and the other of the opto-electrical and electrical elements positioned thereon.

5. The butt joined opto-electronic assembly as recited in claim 1 wherein the first and second carriers further comprise first and second housings with each housing having sidewalls and end walls and a cavity formed in the housing bounded on three sides by the sidewalls and one of the end walls with the cavity intersecting the other end wall defining an open end face on the housing with the standoff dielectric substrate abutting one of the opto-electrical and electrical elements positioned in the cavity of one of the first and second housings and the other element of the opto-electrical and electrical elements positioned in the cavity of the other of the first and second housings.

6. The butt joined opto-electronic assembly as recited in claim 1 wherein the securing member comprises first and second removable attachment members with the first removable attachment member secured to one of the side surfaces of the first and second carriers adjacent to their open end faces and the second removable attachment member secured to the other side surfaces of the first and second carriers adjacent to their open end faces with each removable attachment member having first and second links secured to the respective side surfaces of the first and second carriers with each link having a base and at least a first extension member, two of the extension members projecting past one of the open end faces to overlap the other two extension members, the overlapping extension members being secured together to join the carriers together as a single assembly.

7. A butt joined opto-electronic module for millimeter wavelength frequencies comprising:

a first housing having sidewalls and end walls and a cavity formed in the housing bounded on three sides by the sidewalls and one of the end walls with the cavity intersecting the other end wall defining an open end face on the housing with an opto-electrical element positioned in the cavity of the housing having an end face and at least one horizontal surface with an opto-electrical device formed on of the horizontal surface and coupled to receive an optical signal from an optical waveguide secured to the first housing;

a second housing having sidewalls and end walls and a cavity formed in the housing bounded on three sides by the sidewalls and one of the end walls with the cavity intersecting the other end wall defining an open end face on the housing with an electrical element positioned in the cavity of the housing having an open end face and at least one horizontal surface with an electrical device formed on of the horizontal surface;

first and second coplanar transmission structures with one of the coplanar transmission structures formed on at least one horizontal surface of the opto-electrical element and the other coplanar transmission structure formed on at least one horizontal surface of the electrical element with each of the first and second coplanar transmission structures being electrically coupled to one of the respective opto-electrical and electrical elements;

at least a first standoff dielectric substrate having opposing vertical end walls and at least one horizontal surface with a coplanar transmission structure formed on at least horizontal surface and extending to the vertical end walls with one of the vertical end walls of the standoff dielectric substrate abutting the end face of one of the opto-electrical and electrical elements, the coplanar transmission structure of the abutting opto-electrical and electrical element and the coplanar transmission structure on the standoff dielectric substrate being coplanar and electrically coupled via substantially flat electrical conductors with the coplanar transmission structure of the standoff dielectric substrate and the coplanar transmission structure of the other element of the opto-electrical and electrical elements independently aligned in a proximate abutting relationship;

the first and second housings being independently positioned in a proximate abutting relationship at the open end faces and mechanically joined together as a single module by a securing member with the first and second housings being linearly and rotationally positionable in three mutually perpendicular planes relative to each other to align the coplanar transmission structures of the standoff dielectric substrate and the other element of the opto-electrical and electrical elements; and substantially flat electrical conductors electrically coupling the coplanar transmission structures of the standoff dielectric substrate and the other element of the opto-electrical and electrical elements together.

8. The butt joined opto-electronic module as recited in claim 7 wherein the securing member comprises first and second removable attachment members with the first removable attachment member secured to the one of the sidewalls of the first and second housings adjacent to their open end faces and the second removable attachment member secured to the other sidewalls of the first and second housings adjacent to their open end face with each removable attachment member having first and second links secured to the respective sidewalls of the first and second housings with each link having a base and at least a first extension member, two of the extension members projecting past the open end faces to overlap the other two extension members, the overlapping extension members being secured together to join the housings together as a single module.

9. A butt joined opto-electronic module for millimeter wavelength frequencies comprising:

a first housing having sidewalls and end walls and a cavity formed in the housing bounded on three sides by the sidewalls and one of the end walls with the cavity intersecting the other end wall defining an open end face on the housing with an opto-electrical element positioned in the cavity of the housing having an end face and at least one horizontal surface with an opto-electrical device formed on of the horizontal surface and coupled to receive an optical signal from an optical waveguide secured to the first housing;

a second housing having sidewalls and end walls and a cavity formed in the housing bounded on three sides by the sidewalls and one of the end walls with the cavity intersecting the other end wall defining an open end face on the housing with an electrical element positioned in the cavity of the housing having an open end face and at least one horizontal surface with an electrical device formed on of the horizontal surface;

first and second coplanar transmission structures with one of the coplanar transmission structures formed on at least one horizontal surface of the opto-electrical element and the other coplanar transmission structure formed on at least one horizontal surface of the electrical element with each of the first and second coplanar transmission structures being electrically coupled to one of the respective opto-electrical and electrical elements;

at least a first standoff dielectric substrate having opposing vertical end walls and at least one horizontal surface with a coplanar transmission formed on at least one horizontal surface and extending to the vertical end walls with one of the vertical end walls of the standoff dielectric substrate abutting the end face of one of the opto-electrical and electrical elements, the coplanar transmission structure of the abutting opto-electrical and electrical element and the coplanar transmission structure on the standoff dielectric substrate being coplanar and electrically coupled via substantially flat electrical conductors with the coplanar transmission structure of the standoff dielectric substrate and the coplanar transmission structure of the other element of the opto-electrical and electrical elements independently aligned in a proximate abutting relationship;

first and second removable attachment members with the first removable attachment member secured to the one of the sidewalls of the first and second housings adjacent to their open end faces and the second removable attachment member secured to the other sidewalls of the first and second housings adjacent to their open end faces with each removable attachment member having first and second links secured to the respective sidewalls of the first and second housings with each link having a base and at least a first extension member, two of the extension members projecting past the open end faces to overlap the other two extension members, the overlapping extension members being secured together to join the housings together as a single module;

the first and second housings being independently positioned in a proximate abutting relationship at the open end faces and mechanically joined together as a single module by the first and second removable attachment members with the first and second housings being linearly and rotationally positionable in three mutually perpendicular planes relative to each other to align the coplanar transmission structures of the standoff dielectric substrate and the other element of the opto-electrical and electrical elements; and substantially flat electrical conductors electrically coupling the coplanar transmission structures of the standoff dielectric substrate and the other element of the opto-electrical and electrical elements together.

10. The butt joined opto-electronic module as recited in claim 7 or 9 wherein coplanar transmission structures of the standoff dielectric substrate and the other element of the opto-electrical and electrical elements have sub-millimeter lateral separation.

11. The butt joined opto-electronic module as recited in claim 7 or 9 further comprising at least a first mounting dielectric substrate having an end face, with the first mounting dielectric substrate mounted on at least one of the first and second housings having one of the standoff dielectric substrate and abutting one of the opto-electrical and electrical elements and the other of the opto-electrical and electrical elements positioned thereon.

12. The butt joined opto-electronic module as recited in claim 11 further comprising at least a second mounting dielectric substrate having an end face, the second mounting dielectric substrate mounted on the other of the first and second housings having the other one of the standoff dielectric substrate and abutting one of the opto-electrical and electrical elements and the other of the opto-electrical and electrical elements positioned thereon.

13. The butt joined opto-electronic module as recited in claim 7 or 9 wherein each of the first and second housings further comprise a removable top cover mounted on the end wall and the sidewalls bounding the cavity.

14. The butt joined opto-electronic module as recited in claim 7 or 9 further comprising a removable top cover mounted on the end walls and the sidewalls bounding the cavities of the first and second housings.

15. The butt joined opto-electronic assembly/module as recited in claim 1 or 7 or 9 wherein the opto-electrical element comprises an optical-to-electrical converter.

16. The butt joined opto-electronic assembly/module as recited in claim 15 wherein the optical-to-electrical converter comprises a photodiode.

17. The butt joined opto-electronic assembly/module as recited in claim 1 or 7 or 9 wherein the opto-electrical element comprises a semiconductor laser.

18. The butt joined opto-electronic assembly/module as recited in claim 1 or 7 or 9 wherein the opto-electrical element comprises an optical modulator.

19. The butt joined opto-electronic assembly/module as recited in claim 1 or 7 or 9 wherein the electrical element comprises at least a first sampling diode.

20. The butt joined opto-electronic assembly/module as recited in claim 1 or 7 or 9 wherein the electrical element comprises a laser driver.

21. The butt joined opto-electronic assembly/module as recited in claim 6 or 8 or 9 herein solder is applied to the overlapping extension members.

22. The butt joined opto-electronic assembly/module as recited in claim 6 or 8 or 9 wherein an adhesive is applied to the overlapping extension members.

23. The butt joined opto-electronic assembly/module as recited in claim 22 wherein the adhesive is an epoxy.

24. The butt joined opto-electronic assembly/module as recited in claim 23 wherein the epoxy is an ultraviolet cured epoxy.

25. The butt joined opto-electronic assembly/module as recited in claim 6 or 8 or 9 wherein strong adhesion low melting temperature metal is applied to the overlapping extension members.

26. The buff joined opto-electronic assembly/module as recited in claim 1 or 7 or 9 wherein the substantially flat electrical conductors are wedge bonded electrical conductors.

27. The butt joined opto-electronic assembly/module as recited in claim 1 or 7 or 9 wherein first and second coplanar transmission structures and the standoff dielectric coplanar transmission structure are impedance and dimensionally matched.

28. The butt joined opto-electronic assembly/module as recited in claim 1 or 7 or 9 wherein first and second coplanar transmission structures are dimensionally mismatched and the coplanar transmission structure of the standoff dielectric substrate is an impedance maintaining dimensional transition coplanar waveguide structure.

* * * * *